(12) United States Patent
Ren et al.

(10) Patent No.: US 12,469,668 B2
(45) Date of Patent: Nov. 11, 2025

(54) SYSTEMS AND METHODS FOR COMPENSATING DISPERSION OF A BEAM SEPARATOR IN A SINGLE-BEAM OR MULTI-BEAM APPARATUS

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Xinan Luo, San Jose, CA (US); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 219 days.

(21) Appl. No.: 17/662,453

(22) Filed: May 9, 2022

(65) Prior Publication Data

US 2022/0262594 A1    Aug. 18, 2022

Related U.S. Application Data

(63) Continuation of application No. 16/047,987, filed on Jul. 27, 2018, now Pat. No. 11,328,894.

(Continued)

(51) Int. Cl.
*H01J 37/153* (2006.01)
*H01J 37/05* (2006.01)
(Continued)

(52) U.S. Cl.
CPC ............ *H01J 37/153* (2013.01); *H01J 37/05* (2013.01); *H01J 37/14* (2013.01); *H01J 37/147* (2013.01);
(Continued)

(58) Field of Classification Search
CPC .......... H01J 37/153; H01J 37/05; H01J 37/14; H01J 37/147; H01J 37/1472; H01J 37/244;
(Continued)

(56) References Cited

U.S. PATENT DOCUMENTS 6,509,569 B1   1/2003   Frosien
7,244,949 B2   7/2007   Knippelmeyer et al.
(Continued)

FOREIGN PATENT DOCUMENTS

CN    101593658 A    12/2009
CN    105765691 A    7/2016
(Continued)

OTHER PUBLICATIONS

Office Action issued from the Japanese Patent Office issued in related Japanese Patent Application No. 2022-138254; mailed Aug. 2, 2023 (9 pgs.).

(Continued)

*Primary Examiner* — Robert H Kim
*Assistant Examiner* — Christopher J Gassen
(74) *Attorney, Agent, or Firm* — Finnegan, Henderson, Farabow, Garrett & Dunner, LLP

(57) ABSTRACT

Systems and methods are provided for compensating dispersion of a beam separator in a single-beam or multi-beam apparatus. Embodiments of the present disclosure provide a dispersion device comprising an electrostatic deflector and a magnetic deflector configured to induce a beam dispersion set to cancel the dispersion generated by the beam separator. The combination of the electrostatic deflector and the magnetic deflector can be used to keep the deflection angle due to the dispersion device unchanged when the induced beam dispersion is changed to compensate for a change in the dispersion generated by the beam separator. In some (Continued)

embodiments, the deflection angle due to the dispersion device can be controlled to be zero and there is no change in primary beam axis due to the dispersion device.

20 Claims, 17 Drawing Sheets

Related U.S. Application Data

(60) Provisional application No. 62/538,609, filed on Jul. 28, 2017.

(51) Int. Cl.
*H01J 37/14* (2006.01)
*H01J 37/147* (2006.01)
*H01J 37/24* (2006.01)
*H01J 37/244* (2006.01)
*H01J 37/28* (2006.01)

(52) U.S. Cl.
CPC ........ *H01J 37/1472* (2013.01); *H01J 37/244* (2013.01); *H01J 37/28* (2013.01); *H01J 2237/14* (2013.01); *H01J 2237/151* (2013.01); *H01J 2237/152* (2013.01); *H01J 2237/1532* (2013.01); *H01J 2237/1534* (2013.01); *H01J 2237/2448* (2013.01); *H01J 2237/2806* (2013.01)

(58) Field of Classification Search
CPC .. H01J 37/28; H01J 2237/14; H01J 2237/151; H01J 2237/152; H01J 2237/1532; H01J 2237/1534; H01J 2237/2448; H01J 2237/2806
See application file for complete search history.

(56) References Cited

U.S. PATENT DOCUMENTS

| 8,183,526 | B1 | 5/2012 | Mankos | |
|---|---|---|---|---|
| 2006/0289804 | A1* | 12/2006 | Knippelmeyer | ....... B82Y 40/00 |
| | | | | 250/492.22 |
| 2009/0218506 | A1* | 9/2009 | Nakasuji | .................. H01J 37/26 |
| | | | | 250/492.3 |
| 2012/0006997 | A1* | 1/2012 | Frosien | .................. H01J 37/28 |
| | | | | 250/396 ML |
| 2015/0155134 | A1* | 6/2015 | Frosien | ............... H01J 37/1474 |
| | | | | 250/310 |

FOREIGN PATENT DOCUMENTS

| EP | 2 405 460 A1 | 1/2012 |
|---|---|---|
| JP | 2007-035386 A | 2/2007 |
| JP | 2008-135336 A | 6/2008 |
| JP | 2010-519697 A | 6/2010 |
| JP | 2011-238612 A | 11/2011 |
| JP | 2014-010928 A | 1/2014 |
| JP | 2015-216075 A | 12/2015 |
| JP | 2016139456 A | 8/2016 |
| TW | 201248672 A1 | 12/2012 |
| TW | 201624523 A | 7/2016 |
| TW | 201707038 A | 2/2017 |

OTHER PUBLICATIONS

Second Office Action from the Chinese Patent Office issued in related Chinese Patent Application No. 2018800484627; mailed Jun. 2, 2022 (12 pgs.).

Notice of Deficiencies from the Israel Patent Office issued in related Israeli Patent Application No. 272196; mailed Apr. 23, 2023 (3 pgs.).

* cited by examiner

SYSTEMS AND METHODS FOR COMPENSATING DISPERSION OF A BEAM SEPARATOR IN A SINGLE-BEAM OR MULTI-BEAM APPARATUS

RELATED APPLICATIONS

This application is a continuation of U.S. patent application Ser. No. 16/047,987, filed Jul. 27, 2018 which claims the benefit of U.S. provisional application no. 62/538,609, filed Jul. 28, 2017, the contents of all of which are incorporated herein by reference in their entirety.

TECHNICAL FIELD

The present disclosure generally relates to the field of charged particle beam apparatus, and more particularly, to systems and methods for compensating dispersion of a beam separator in a single-beam or multi-beam apparatus.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at probe spots of a wafer under inspection. The interactions of the primary electrons with the wafer can result in one or more secondary electron beams. The secondary electron beams may comprise backscattered electrons, secondary electrons, or Auger electrons, resulting from the interactions of the primary electrons with the wafer. The intensity of the one or more secondary electron beams can vary based on the properties of the internal and/or external structures of the wafer.

The intensity of the secondary electron beams can be determined using a detection device or detector. The secondary electron beams can form one or more beam spots at pre-determined locations on a surface of the detector. The detector can generate electrical signals (e.g., a current, a voltage, etc.) that represent an intensity of the detected secondary electron beams. The electrical signals can be measured with measurement circuitries (e.g., analog-to-digital converters) to obtain a distribution of the detected electrons. The electron distribution data collected during a detection time window, in combination with corresponding scan path data of the one or more primary electron beams incident on the wafer surface, can be used to reconstruct images of the wafer structures under inspection. The reconstructed images can be used to reveal various features of the internal and/or external structures of the wafer, and can be used to reveal any defects that may exist in the wafer.

In an inspection system comprising a single primary beam and a single secondary beam (single-beam apparatus), the detector can be placed along an optical axis of the apparatus if it has a hole allowing the primary beam to pass through. However, the presence of the hole can reduce detection efficiency of the secondary beam and in some cases result in a black spot on the center of the reconstructed images. A beam separator can be used to separate the secondary beam from the primary beam and direct the secondary beam towards a detector placed off-axis. In an inspection system comprising multiple primary beams and multiple secondary beams (multi-beam apparatus), a beam separator can be used to separate the multiple secondary beams from the multiple primary beams and direct the multiple secondary beams towards a detector placed off-axis.

The beam separator comprises at least one magnetic deflector and therefore generates dispersion on the one or more primary beams and the one or more secondary beams. The dispersion can deform the round probe spot of a primary beam into an oblong shape. The dispersion can also deform the detected beam spots thereby causing deterioration in resolution of the reconstructed image. The beam separator also adds an associated astigmatism aberration to the primary and secondary beams. Further, a deflection angle associated with the beam separator results in a non-straight path of the primary beam. The optical elements of the single-beam or multi-beam apparatus, placed between the beam source and the beam separator, need to be tilted with respect to the optical axis. The titled arrangement and associated alignment adds complexity to the apparatus. Additionally, for any change in the energy of the primary beam, the beam separator can be adjusted to maintain the deflection angle of the primary beam constant. However, the adjustment causes an associated change in the deflection angle of the secondary beam. The uncontrolled change in deflection angle of the secondary beam can cause a reduction in detection efficiency in both single-beam and multi-beam apparatus and can also cross-talk issues in a multi-beam apparatus.

SUMMARY

Embodiments of the present disclosure provide systems and methods for compensating dispersion of a beam separator in a single-beam or multi-beam apparatus. In some embodiments, a dispersion device is provided. The dispersion device comprises an electrostatic deflector and a magnetic deflector configured for inducing a first beam dispersion to a charged particle beam of the system. The first beam dispersion is set to cancel an impact of a second beam dispersion of the beam caused by the beam separator. The electrostatic deflector exerts a first force on the beam and the magnetic deflector exerts a second force on the beam, and the first force and the second force are substantially opposite to each other and form the first beam dispersion.

In some embodiments, a charged particle beam apparatus is provided. The charged particle beam apparatus comprises a source for generating a primary charged particle beam, a first dispersion device below the source, a beam separator below the first dispersion device, an objective lens below the beam separator, a sample stage for supporting a sample and a detector above the beam separator. The primary charged particle beam is focused by the objective lens onto the sample, forms a primary probe spot thereon and generates a secondary charged particle beam therefrom. The beam separator separates the primary charged particle beam and the secondary charged particle beam so that the secondary charged particle beam is detected by the detector. The first dispersion device generates a first primary beam dispersion to the primary charged particle beam and the beam separator generates a second primary beam dispersion to the primary charged particle beam and a second secondary beam dispersion to the secondary charged particle beam. The first dispersion device comprises a first electrostatic deflector and a first magnetic deflector respectively exerting a first force and a second force on the primary charged particle beam, and the first force and the second force are opposite to each other and form the first primary beam dispersion, wherein the first primary beam dispersion is adjusted to make the first primary beam dispersion cancel an impact of the second primary beam dispersion on the primary probe spot.

In some embodiments, a method for controlling dispersion in a charged particle beam system with a beam separator is provided. The method comprises providing a first dispersion device in a path of a primary charged particle beam of the system, placing the first dispersion device upstream of the beam separator, generating a first primary beam dispersion to the primary charged particle beam by the first dispersion device, and adjusting the first primary beam dispersion to cancel an impact of a second primary beam dispersion of the primary charged particle beam caused by the beam separator. The first dispersion device comprises a first electrostatic deflector and a first magnetic deflector respectively exerting a first force and a second force on the primary charged particle beam, and the first force and the second force are opposite to each other and form the first primary beam dispersion.

In some embodiments, a charged particle beam apparatus is provided. The charged particle beam apparatus comprises a source configured to provide a primary charged particle beam; a source conversion unit configured to form a plurality of parallel images of the source using a plurality of beamlets of the primary charged particle beam; a first projection system with an objective lens and configured to project the plurality of parallel images onto a sample and therefore form a plurality of primary probe spots thereon with the plurality of beamlets; a beam separator configured to separate the plurality of beamlets and a plurality of secondary charged particle beams generated from the sample by the plurality of primary probe spots; a detection device with a plurality of detection elements; a secondary projection system configured to focus the plurality of secondary charged particle beams onto the detection device and form a plurality of secondary probe spots thereon, and the plurality of secondary probe spots are detected by the plurality of detection elements; and a first dispersion device arranged upstream of the beam separator and configured to generate a plurality of first primary beam dispersions to the plurality of beamlets, wherein the plurality of first primary beam dispersions is adjusted to cancel impacts of a plurality of second primary beam dispersions generated by the beam separator to the plurality of primary probe spots. The first dispersion device comprises a first electrostatic deflector and a first magnetic deflector respectively exerting a first force and a second force on each of the plurality of beamlets, the first force and the second force are opposite to each other and form the corresponding first primary beam dispersion.

In some embodiments, a method for controlling dispersion in a charged particle beam system with a beam separator is provided. The method comprises providing a source conversion unit to form a plurality of images of a source by a plurality of beamlets of a primary charged particle beam generated by the source; providing a first dispersion device in paths of the plurality of beamlets; placing the first dispersion device upstream of the beam separator; generating a plurality of first primary beam dispersions to the plurality of beamlets by the first dispersion device; and adjusting the plurality of first primary beam dispersions to cancel impacts of a plurality of second primary beam dispersions generated by the beam separator to the plurality of beamlets. The first dispersion device comprises a first electrostatic deflector and a first magnetic deflector respectively exerting a first force and a second force on each of the plurality of beamlets, the first force and the second force are opposite to each other and form the corresponding first primary beam dispersion Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present disclosure relates to systems and methods for compensating dispersion of a beam separator in a single-beam or multi-beam apparatus. A beam separator generates dispersion on the one or more primary beams and the one or more secondary beams. Embodiments of the present disclosure provide a dispersion device comprising an electrostatic deflector and a magnetic deflector configured to induce a beam dispersion set to cancel the dispersion generated by the beam separator. The combination of the electrostatic deflector and the magnetic deflector can be used to keep a deflection angle (due to the dispersion device) unchanged when the induced beam dispersion is changed to compensate for a change in the dispersion generated by the beam separator. In some embodiments, the deflection angle can be controlled to be zero and there is no change in primary beam axis due to the dispersion device. In some embodiments, the dispersion device can comprise a multi-pole lens (e.g., quadrupole lens) configured to generate a quadrupole field to cancel at least one of the impacts of astigmatism aberrations caused by the beam separator and the dispersion device on the probe spot formed by the primary beam.

Figure 1:
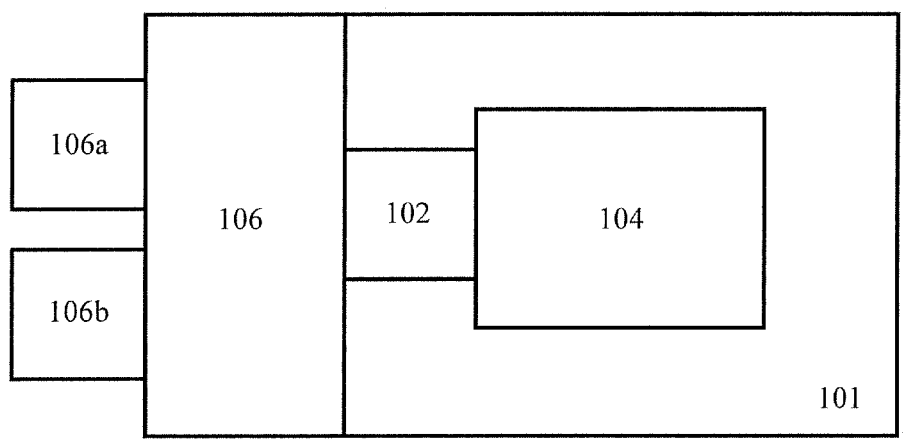
FIG. 1 is a schematic diagram illustrating an exemplary electron beam inspection (EBI) system, consistent with embodiments of the present disclosure.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101.

EFEM 106 includes a first loading port 106a and a second loading port 106b. EFEM 106 may include additional loading port(s). First loading port 106a and second loading port 106b can receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 can transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) can transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104.

Figure 2A:
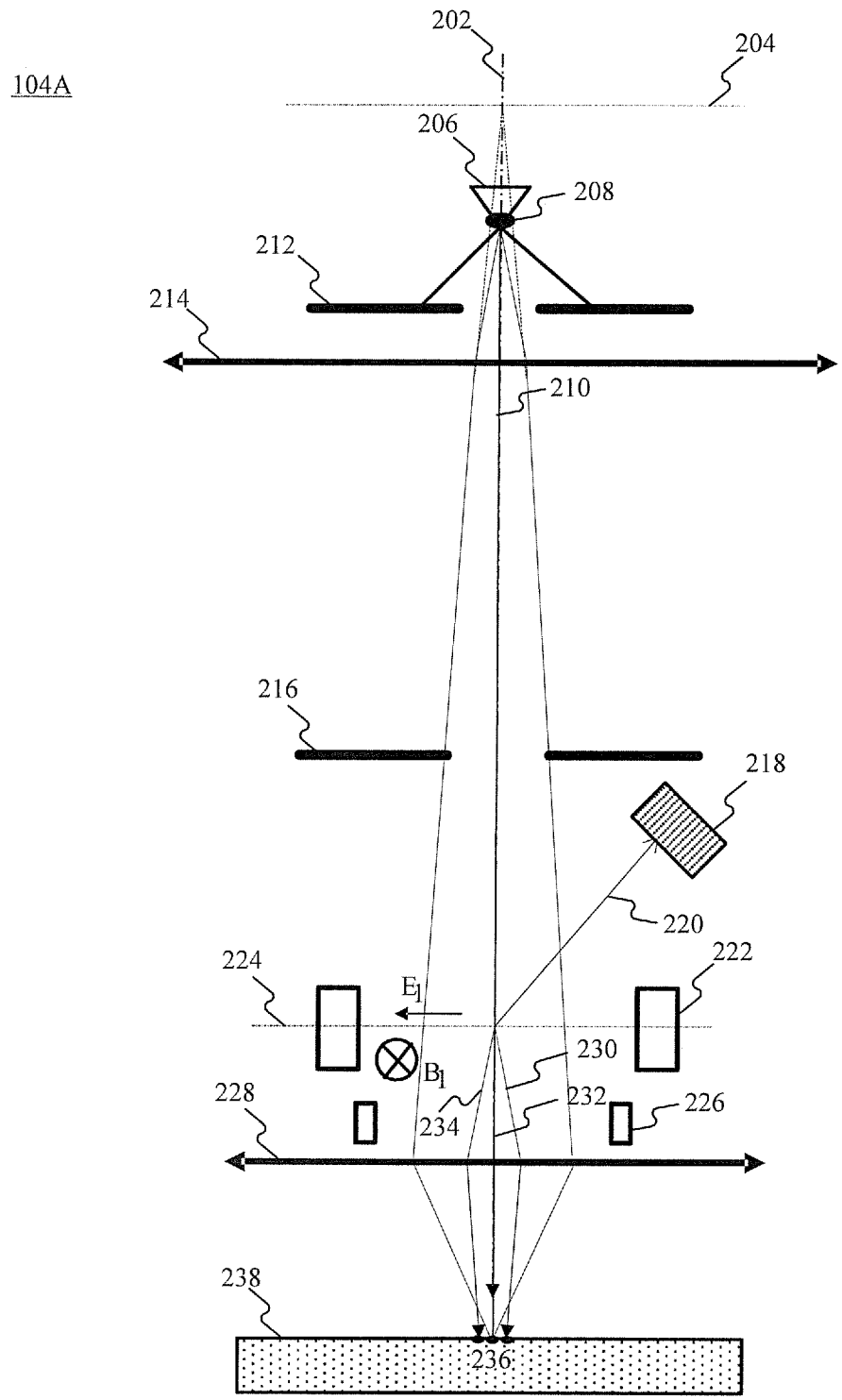
FIG. 2A, 2B are schematic diagrams illustrating an exemplary electron beam tool that can be a part of the exemplary electron beam inspection system of FIG. 1, consistent with embodiments of the present disclosure.

Reference is now made to FIG. 2A, which illustrates exemplary components of electron beam tool 104 consistent with embodiments of the present disclosure. FIG. 2A illustrates an electron beam tool 104A (also referred to herein as apparatus 104A) comprising an electron source 206, a gun aperture 212, a condenser lens 214, a primary electron beam 210 emitted from electron source 206, a beam-limit aperture 216, a beam separator 222, a deflection scanning unit 226, an objective lens 228, a sample stage (not shown in FIG. 2A), a secondary electron beam 220, and an electron detector 218. Electron source 206, gun aperture 212, condenser lens 214, beam-limit aperture 216, beam separator 222, deflection scanning unit 226, and objective lens 228 can be aligned with optical axis 202 of apparatus 104A.

Electron source 206 can comprise a cathode, an extractor or an anode, wherein primary electrons can be emitted from the cathode and extracted or accelerated to form a primary electron beam 210 with high energy (e.g., 8-20 keV), high angular intensity (e.g., 0.1-1 mA/sr) and a crossover (virtual or real) 208. Primary electron beam 210 can be visualized as being emitted from crossover 208. Gun aperture 212 can block off peripheral electrons of primary electron beam 210 to reduce Coulomb effect. The Coulomb effect can cause an increase in size of a probe spot 236.

Condenser lens 214 can focus primary electron beam 210 and beam-limit aperture 216 can limit the size of primary electron beam 210. The electric current of primary electron beam 210 downstream of beam-limit aperture 216 can be varied by adjusting the focusing power of condenser lens 214 or by changing the radial size of beam-limit aperture 216. Objective lens 228 can focus primary electron beam 210 onto a sample 238 for inspection. Primary electron beam 210 can form probe spot 236 on surface of sample 238. Condenser lens 214 may be a movable condenser lens that may be configured so that the position of its first principle plane is movable.

In response to incidence of primary electron beam 210 at probe spot 236, secondary electron beam 220 can be emitted from sample 238. Secondary electron beam 220 can comprise electrons with a distribution of energies including secondary electrons (energies≤50 eV) and backscattered electrons (energies between 50 eV and landing energies of primary electron beam 210).

Beam separator 222 can be a beam separator of Wien filter type comprising an electrostatic deflector generating an electrostatic dipole field E1 and a magnetic dipole field B1. For a beam separator of Wien filter type, the force exerted by electrostatic dipole field E1 on an electron of primary electron beam 210 is equal in magnitude and opposite in direction to the force exerted on the electron by magnetic dipole field B1. Primary electron beam 210 can therefore pass straight through beam separator 222 with zero deflection angle. However, the total dispersion of primary electron beam 210 generated by beam separator 222 is non-zero. For a dispersion plane 224 of beam separator 222, FIG. 2A shows dispersion of primary electron beam 210 with nominal energy $V_0$ and an energy spread $\Delta V$ into beam portion 230 corresponding to energy $V_0-\Delta V/2$, beam portion 232 corresponding to energy $V_0$, and beam portion 234 corresponding to energy $V_0+\Delta V/2$. The total force exerted by beam separator 222 on an electron of secondary electron beam 220 is non-zero. Beam separator 222 can therefore separate secondary electron beam 220 from primary electron beam 210 and direct secondary electron beam 220 towards electron detector 218. Electron detector 218 can detect secondary electron beam 220 and generate a corresponding signal.

Deflection scanning unit 226 can deflect primary electron beam 210 to scan probe spot 236 over a surface area of sample 238. Electron detector 218 can detect corresponding secondary electron beam 220 and generate corresponding signals used to reconstruct an image of surface area of sample 238.

An object plane 204 of objective lens 228 can shift with changes in focusing power of condenser lens 214. For primary electron beam 210, if dispersion plane 224 of beam separator 222 and object plane 204 of objective lens 228 do not coincide, beam portions 230, 232, and 234 stay separated and probe spot 236 is extended in the dispersion direction. This can cause deterioration in resolution of reconstructed image of sample 238.

Figure 2B:
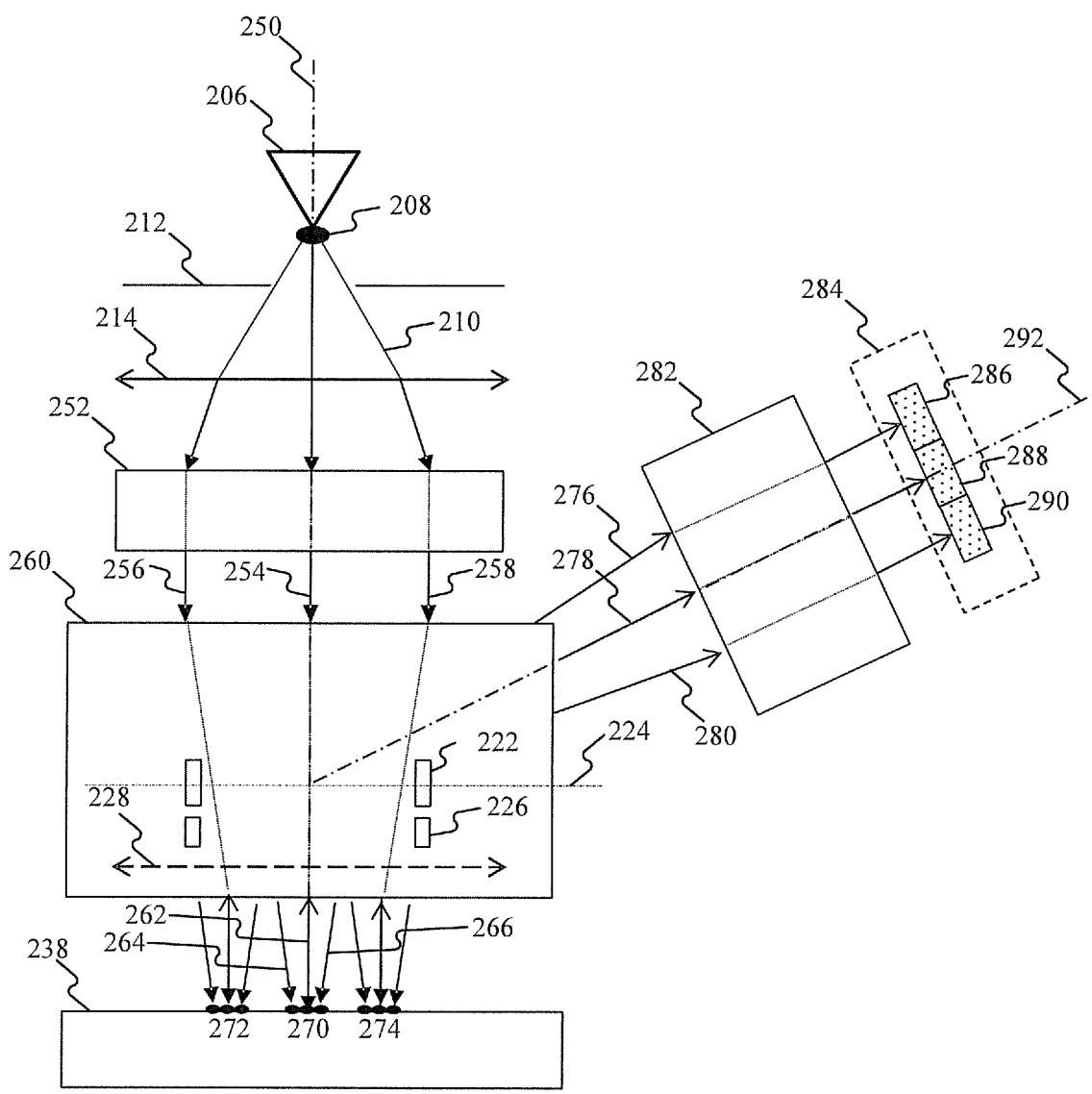

Reference is now made to FIG. 2B, which illustrates an electron beam tool 104B (also referred to herein as apparatus 104B) comprising an electron source 206, a gun aperture 212, a condenser lens 214, a primary electron beam 210 emitted from electron source 206, a source conversion unit 252, a plurality of beamlets 254, 256, and 258 of primary electron beam 210, a primary projection optical system 260, a sample stage (not shown in FIG. 2B), multiple secondary electron beams 276, 278, and 280, a secondary optical system 282, and an electron detection device 284. Primary projection optical system 260 can comprise an objective lens 228. Electron detection device 284 can comprise detection elements 286, 288, and 290. Beam separator 222 and deflection scanning unit 226 can be placed inside primary projection optical system 260.

Electron source 206, gun aperture 212, condenser lens 214, source conversion unit 252, beam separator 222, deflection scanning unit 226, and objective lens 228 can be aligned with a primary optical axis 250 of apparatus 104B. Secondary optical system 282 and electron detection device 284 can be aligned with a secondary optical axis 292 of apparatus 104B.

Electron source 206 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 212 can block off peripheral electrons of primary electron beam 210 to reduce Coulomb effect. The Coulomb effect can cause an increase in size of probe spots 270, 272, and 274.

Source conversion unit 252 can comprise an array of image-forming elements (not shown in FIG. 2B) and an array of beam-limit apertures (not shown in FIG. 2B). The array of image-forming elements can comprise an array of micro-deflectors or micro-lenses. The array of image-forming elements can form a plurality of parallel images (virtual or real) of crossover 208 with a plurality of beamlets 254, 256, and 258 of primary electron beam 210. The array of beam-limit apertures can limit the plurality of beamlets 254, 256, and 258.

Condenser lens 214 can focus primary electron beam 210. The electric currents of beamlets 254, 256, and 258 downstream of source conversion unit 252 can be varied by adjusting the focusing power of condenser lens 214 or by changing the radial sizes of the corresponding beam-limit apertures within the array of beam-limit apertures. Objective lens 228 can focus beamlets 254, 256, and 258 onto a sample 238 for inspection and can form a plurality of probe spots 270, 272, and 274 on surface of sample 238.

Condenser lens 214 may be a movable condenser lens that may be configured so that the position of its first principle plane is movable. The movable condenser lens may be configured to be magnetic, which may result in off-axis beamlets, for example beamlets 256 and 258, landing on elements of source conversion unit 252 (such as the array of image-forming elements) with rotation angles. The rotation angles may change with the focusing power and the position of the first principal plane of the movable condenser lens. In some embodiments, condenser lens 214 may be an anti-rotation condenser lens. An anti-rotation lens may have a focusing power that may be changed without influencing a rotation angle of electron beams passing therethrough. An anti-rotation lens may be formed by two or more lenses, for example by two magnetic lenses or by one magnetic lens and one electrostatic lens. Condenser lens 214 may be a movable anti-rotation condenser lens, which involves an anti-rotation lens with a movable first principal plane. A movable anti-rotation lens may be formed by three lenses, for example. Movable condenser lens and anti-rotation lens are further described in International Application No. PCT/EP2017/084429, which is incorporated by reference in its entirety.

Beam separator 222 can be a beam separator of Wien filter type comprising an electrostatic deflector generating an electrostatic dipole field E1 and a magnetic dipole field B1 (both of which are not shown in FIG. 2B). If they are applied, the force exerted by electrostatic dipole field E1 on an electron of beamlets 254, 256, and 258 is equal in magnitude and opposite in direction to the force exerted on the electron by magnetic dipole field B1. Beamlets 254, 256, and 258 can therefore pass straight through beam separator 222 with zero deflection angle. However, the total dispersion of beamlets 254, 256, and 258 generated by beam separator 222 is non-zero. For a dispersion plane 224 of beam separator 222, FIG. 2B shows dispersion of beamlet 254 with nominal energy $V_0$ and an energy spread $\Delta V$ into beamlet portions 262 corresponding to energy $V_0$, beamlet portion 264 corresponding to energy $V_0+\Delta V/2$, and beamlet portion 266 corresponding to energy $V_0-\Delta V/2$. The total force exerted by beam separator 222 on an electron of secondary electron beams 276, 278, and 280 is non-zero. Beam separator 222 can therefore separate secondary electron beams 276, 278, and 280 from beamlets 252, 254, and 256 and direct secondary electron beams 276, 278, and 280 towards secondary optical system 282.

Deflection scanning unit 226 can deflect beamlets 254, 256, and 258 to scan probe spots 270, 272, and 274 over a surface area of sample 238. In response to incidence of beamlets 254, 256, and 258 at probe spots 270, 272, and 274, secondary electron beams 276, 278, and 280 can be emitted from sample 238. Secondary electron beams 276, 278, and 280 can comprise electrons with a distribution of energies including secondary electrons (energies≤50 eV) and backscattered electrons (energies between 50 eV and landing energies of beamlets 254, 256, and 258). Secondary optical system 282 can focus secondary electron beams 276, 278, and 280 onto detection elements 286, 288, and 290 of electron detection device 284. Detection elements 286, 288, and 290 can detect corresponding secondary electron beams 276, 278, and 280 and generate corresponding signals used to reconstruct an image of surface area of sample 238.

Figure 3A:
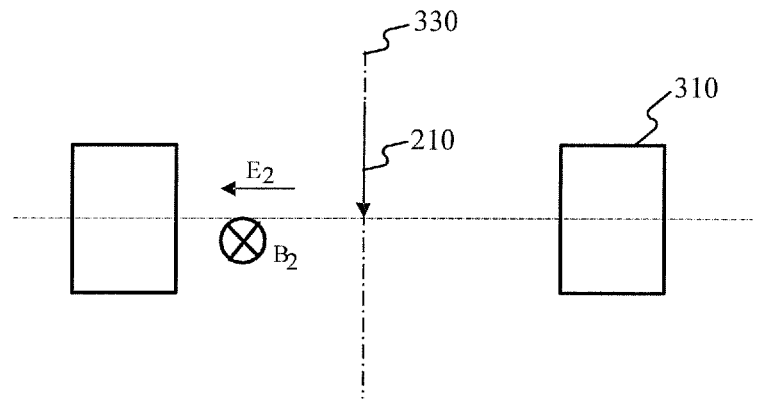
FIG. 3A, 3B, 3C are schematic diagrams illustrating exemplary dispersion devices, consistent with embodiments of the present disclosure.

Reference is now made to FIG. 3A, which is a schematic diagram illustrating exemplary dispersion devices, consistent with embodiments of the present disclosure. FIG. 3A illustrates a dispersion device 310 comprising an electrostatic deflector and a magnetic deflector. The electrostatic deflector can generate an electrostatic dipole field $E_2$ and the magnetic deflector can generate a magnetic dipole field $B_2$, wherein $E_2$ and $B_2$ are superposed substantially perpendicular to each other and to an optical axis 330. The electrostatic dipole field E2 exerts a force $F_e$ and the magnetic dipole field $B_2$ exerts a force $F_m$ on an electron of an electron beam 210 propagating along optical axis 330. The forces $F_e$ and $F_m$ act in substantially opposite directions. The total force exerted by the electrostatic dipole field $E_2$ and the magnetic dipole field $B_2$ on an electron with nominal energy $V_0$ and nominal velocity $v_0$ can be calculated using the following equation:

$$F(v_0) = F_e + F_m = e(E_2 - v_0 \times B_2) \quad (1)$$

For an electron with energy $V_0+dV$ and velocity $v_0+dv$, the total force exerted by the electrostatic dipole field $E_2$ and the magnetic dipole field $B_2$ can be calculated using the following equation:

$$F(v_0+dv) = F_e + F_m = F(v_0) - (e \times dv \times B_2) \quad (2)$$

Figure 3B:
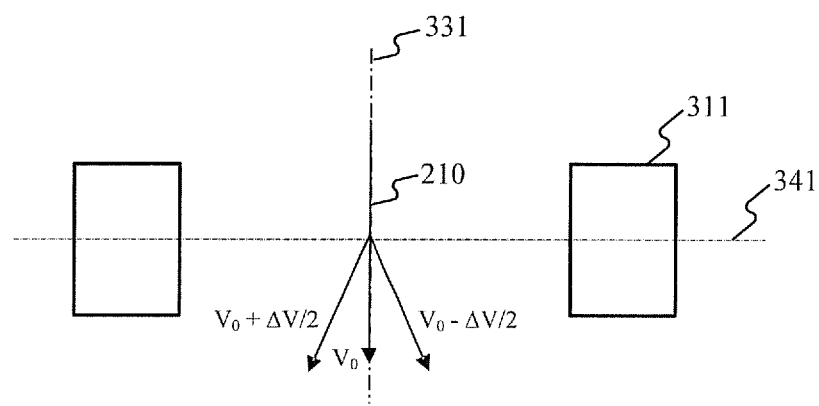

Reference is now made to FIG. 3B, which illustrates a dispersion device 311 consistent with embodiments of the present disclosure. Dispersion device 311, similar to dispersion device 310, comprises an electrostatic deflector and a magnetic deflector capable of generating a corresponding electrostatic dipole field $E_2$ and magnetic dipole field $B_2$. The electrostatic deflector and magnetic deflector can be arranged wherein $E_2$ and $B_2$ are superposed substantially perpendicular to each other and to an optical axis 331. In dispersion device 311, electrostatic dipole field $E_2$ and magnetic dipole field $B_2$ can be controlled wherein the total force $(F_e + F_m)$ can be substantially zero when changing $E_2$ and $B_2$. Accordingly, the nominal deflection angle is zero as illustrated in FIG. 3B.

The deflection dispersion induced by dispersion device 311 at a dispersion plane 341 can be controlled by varying $E_2$ and $B_2$ while maintaining the deflection angle at zero.

Figure 3C:
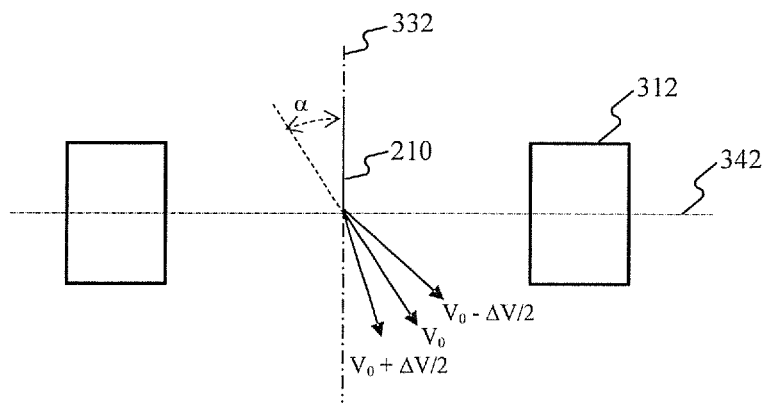

Reference is now made to FIG. 3C, which illustrates a dispersion device 312 consistent with embodiments of the present disclosure. Dispersion device 312, similar to dispersion devices 310 and 311, comprises an electrostatic deflector and a magnetic deflector capable of generating a corresponding electrostatic dipole field $E_2$ and magnetic dipole field $B_2$. The electrostatic deflector and magnetic deflector can be arranged wherein $E_2$ and $B_2$ are superposed substantially perpendicular to each other and to an optical axis 332. In dispersion device 312, electrostatic dipole field $E_2$ and magnetic dipole field $B_2$ can be controlled wherein the total force $(F_e + F_m)$ can be a constant non-zero value when changing $E_2$ and $B_2$. Accordingly, the nominal deflection angle $\alpha$ is non-zero as illustrated in FIG. 3C. The deflection dispersion induced by dispersion device 312 at a dispersion plane 342 can be controlled by varying $E_2$ and $B_2$ while maintaining the deflection angle at $\alpha$.

Figure 4A:
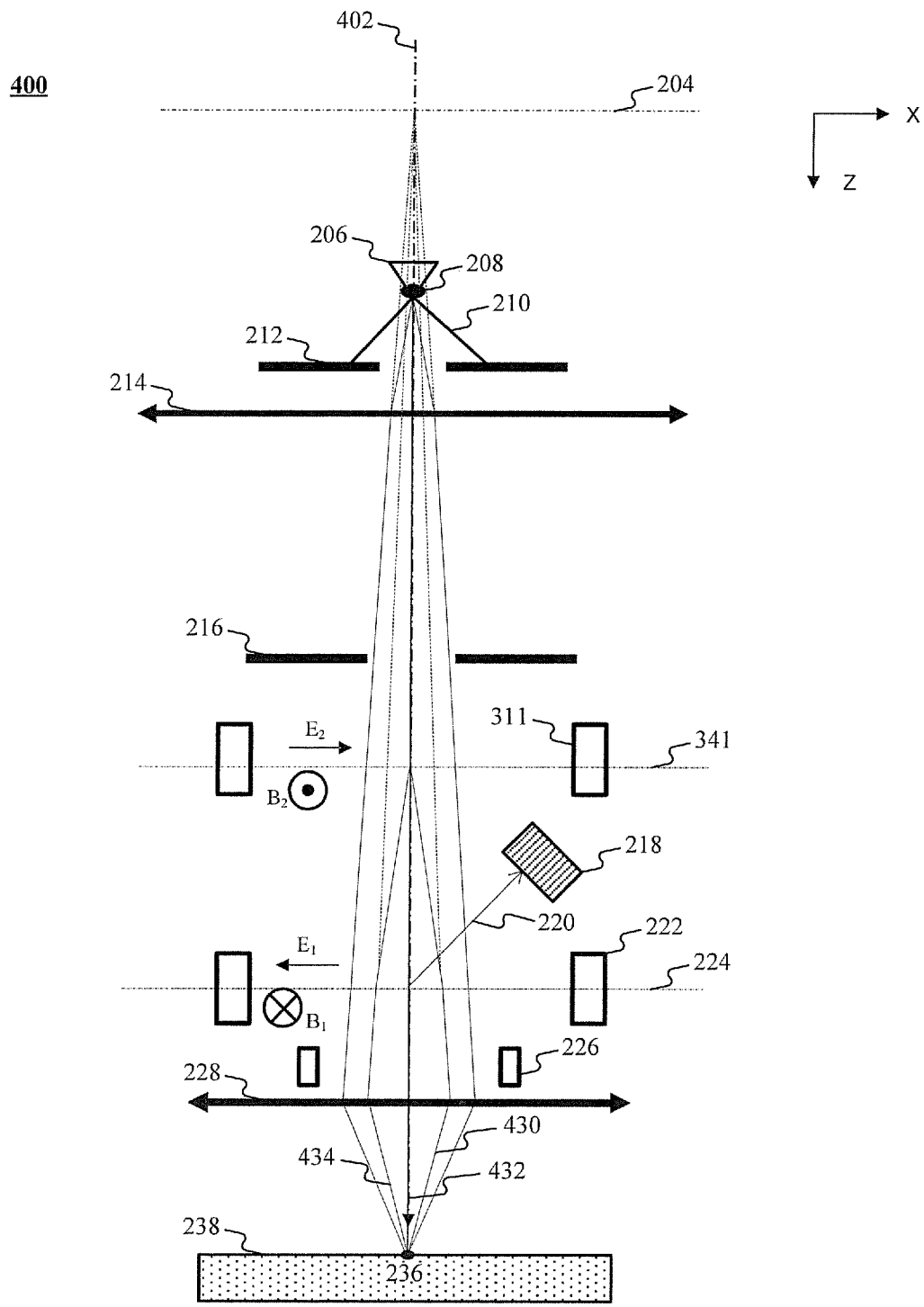
FIGS. 4A, 4B are schematic diagrams illustrating an exemplary single-beam apparatus, consistent with embodiments of the present disclosure.
Figure 4B:
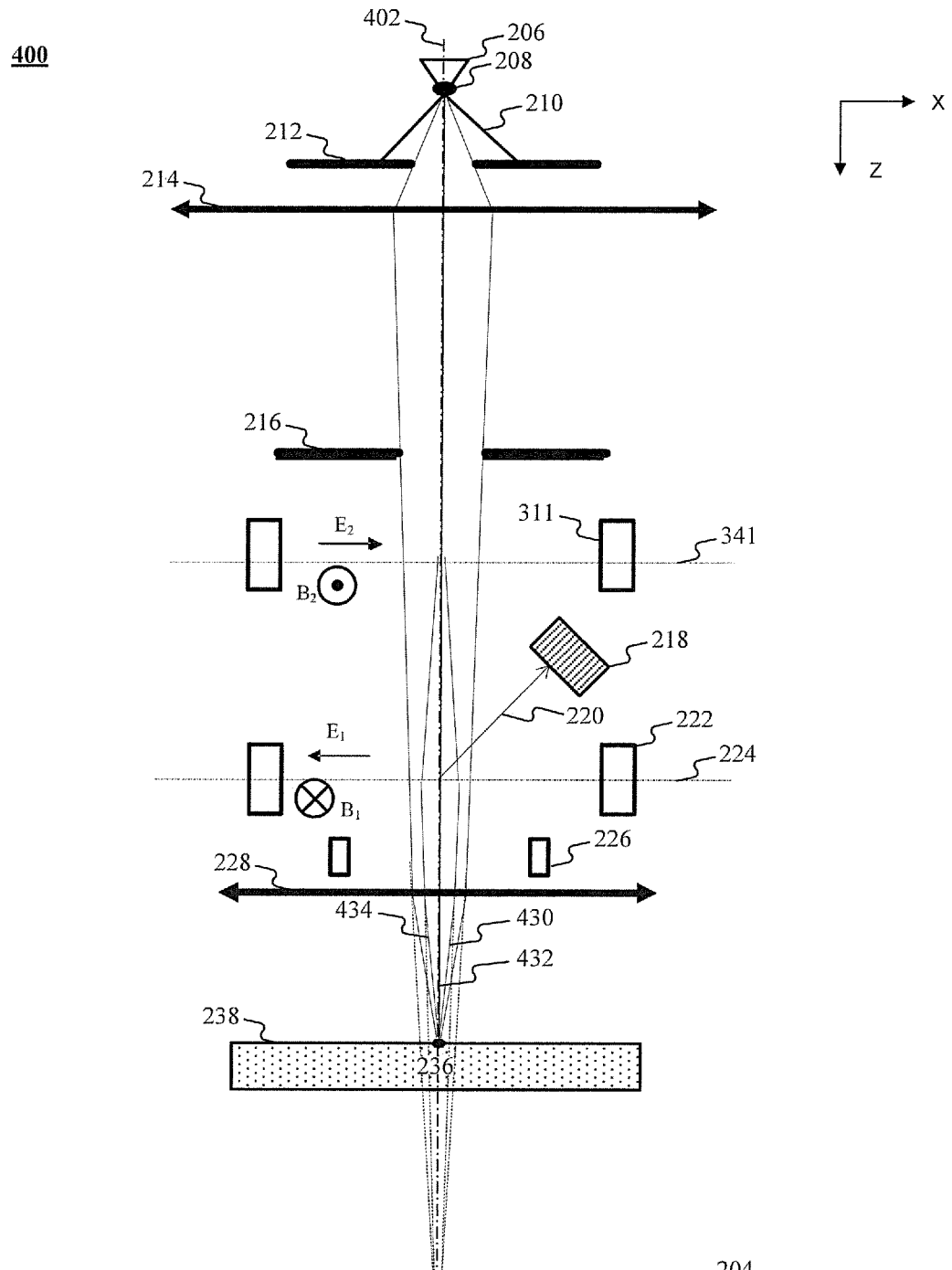

Reference is now made to FIG. 4A, which illustrates an exemplary single-beam apparatus 400, consistent with embodiments of the present disclosure. Single-beam apparatus 400 can be electron beam tool 104A of FIG. 2A further comprising dispersion device 311 of FIG. 3B. FIG. 4A illustrates operation of dispersion device 311 for a case where object plane 204 of objective lens 228 is above objective lens 228. FIG. 4B illustrates operation of dispersion device 311 for a case where object plane 204 of objective lens 228 is below objective lens 228. As described below, disclosed embodiments can compensate beam dispersion without limiting the operation mode of objective lens 228.

Single-beam apparatus 400 can comprise electron source 206, gun aperture 212, condenser lens 214, primary electron beam 210 emitted from electron source 206, beam-limit aperture 216, dispersion device 311, beam separator 222, deflection scanning unit 226, objective lens 228, secondary electron beam 220, and electron detector 218. Electron source 206, gun aperture 212, condenser lens 214, beam-limit aperture 216, dispersion device 311, beam separator 222, deflection scanning unit 226, and objective lens 228 can be aligned with optical axis 402 of single-beam apparatus 400.

As described above with reference to FIG. 3B, the nominal dispersion angle associated with dispersion device 311 is zero and primary electron beam 210 can pass straight through dispersion device 311. Dispersion device 311 can induce a beam dispersion based on the values of $E_2$ and $B_2$. Primary electron beam 210 can also pass straight through beam separator 222 of Wien filter type. Beam separator 222 can also induce a beam dispersion based on the values of $E_1$ and $B_1$. The beam dispersion induced by beam separator 222 can be referred to as main dispersion (MDS) and the beam dispersion induced by dispersion device 311 can be referred to as compensation dispersion (CDS). Dispersion device 311 can be configured and controlled to generate CDS opposite in direction to the MDS. For example, with reference to FIG. 4A, an electron with energy>nominal energy $V_0$ can be deflected towards $-x$ direction by beam separator 222 and towards $+x$ direction by dispersion device 311 (corresponding to beam path 430). An electron with energy<nominal energy $V_0$ can be deflected towards $+x$ direction by beam separator 222 and towards $-x$ direction by dispersion device 311 (corresponding to beam path 434). The magnitude of CDS generated by dispersion device 311 can be controlled to make electrons with energies different from nominal energy $V_0$ (for example, electrons corresponding to beam paths 430 and 434) to virtually focus on object plane 204. Accordingly, objective lens 228 focuses primary electron beam 210 onto sample 238 to form probe spot 236.

Figure 5:
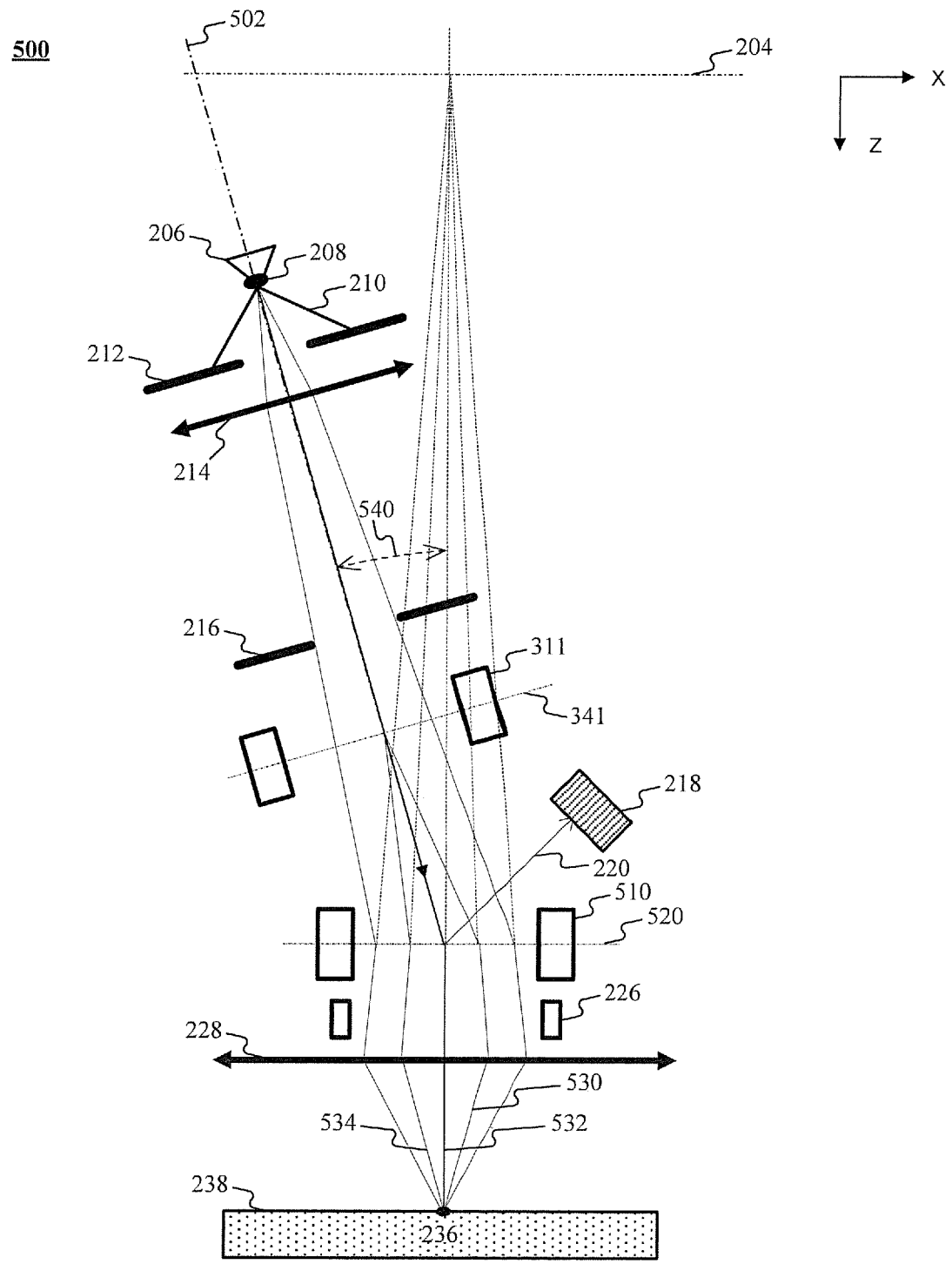
FIG. 5 is a schematic diagram illustrating an exemplary single-beam apparatus, consistent with embodiments of the present disclosure.

Reference is now made to FIG. 5, which illustrates an exemplary single-beam apparatus 500, consistent with embodiments of the present disclosure. Single-beam apparatus 500 can comprise electron source 206, gun aperture 212, condenser lens 214, primary electron beam 210 emitted from electron source 206, beam-limit aperture 216, dispersion device 311, beam separator 510, deflection scanning unit 226, objective lens 228, secondary electron beam 220, and electron detector 218. Beam separator 510 comprises a magnetic deflector and therefore associated deflection angle 540 has a non-zero value. Electron source 206, gun aperture 212, condenser lens 214, beam-limit aperture 216, dispersion device 311, beam separator 510, deflection scanning unit 226, and objective lens 228 can be aligned with respect to optical axis 502 of single-beam apparatus 500.

As described above with reference to FIG. 3B, the nominal dispersion angle associated with dispersion device 311 is zero and primary electron beam 210 can pass straight through dispersion device 311 and with an associated beam dispersion CDS. An electron of primary electron beam 210 traveling along optical axis 502 with nominal energy $V_0$ can be incident at beam separator 510 with an incident angle 540 (to optical axis of beam separator 510). An electron traveling along optical axis 502 with energy>$V_0$ can be incident at beam separator 510 with an incident angle<angle 540. An electron traveling along optical axis 502 with energy<$V_0$ can be incident at beam separator 510 with an incident angle>angle 540.

Beam separator 510 can deflect primary electron beam 210 with a nominal deflection angle equal to angle 540 and an associated beam dispersion MDS. An electron with nominal energy $V_0$ can be deflected at an angle equal to angle 540. An electron with energy>$V_0$ can be deflected at an angle less than angle 540. An electron with energy<$V_0$ can be deflected at an angle greater than angle 540.

The CDS generated by dispersion device 311 can be controlled wherein the incident angle variation generated by CDS for electrons with different energies can compensate the deflection angle variation generated by MDS. Accordingly, the electrons with different energies can be controlled to virtually focus on object plane 204. Further, objective lens 228 can focus the electrons with different energies (corresponding to beam paths 530, 532, and 534) onto sample 238 to form probe spot 236.

Figure 6:
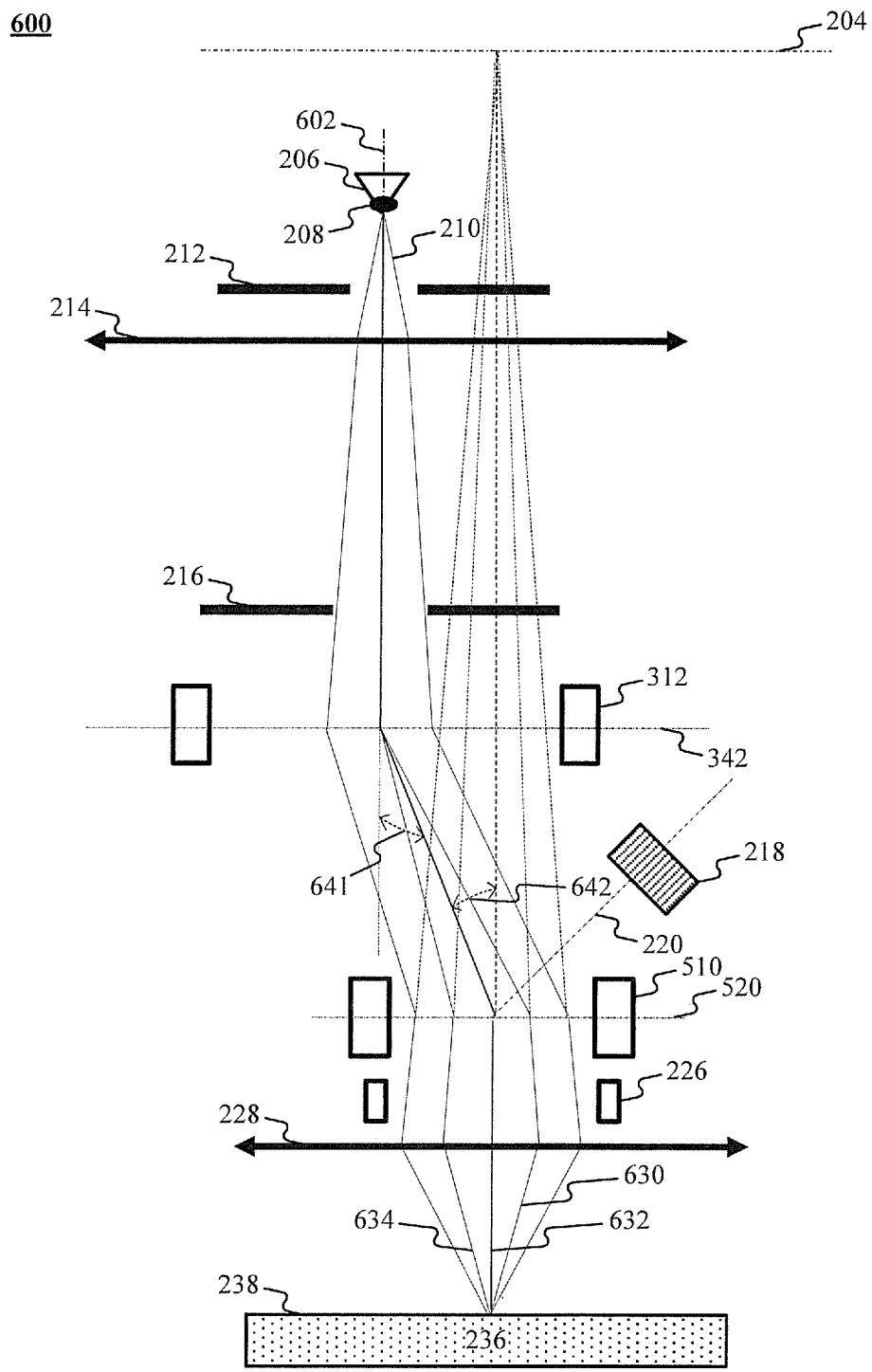
FIG. 6 is a schematic diagram illustrating an exemplary single-beam apparatus, consistent with embodiments of the present disclosure.

Reference is now made to FIG. 6 which illustrates an exemplary single-beam apparatus 600, consistent with embodiments of the present disclosure. Single-beam apparatus 600 can comprise electron source 206, gun aperture 212, condenser lens 214, primary electron beam 210 emitted from electron source 206, beam-limit aperture 216, dispersion device 312, beam separator 510, deflection scanning unit 226, objective lens 228, secondary electron beam 220, and electron detector 218. Beam separator 510 comprises a magnetic deflector and therefore associated deflection angle 642 has a non-zero value. Electron source 206, gun aperture 212, condenser lens 214, beam-limit aperture 216, dispersion device 312, beam separator 510, deflection scanning unit 226, and objective lens 228 can be aligned with respect to optical axis 602 of single-beam apparatus 600.

As described above with reference to FIG. 3C, the nominal dispersion angle associated with dispersion device 312 is non-zero and primary electron beam 210 can pass through dispersion device 312 with a nominal deflection angle 641 and with an associated beam dispersion CDS. For single-beam apparatus 600, an electron of primary electron beam 210 traveling along optical axis 602 with nominal energy $V_0$ can be deflected by angle 641 at deflection plane 342 (of dispersion device 312) and can be incident at deflection plane 520 (of beam separator 510) at an incident angle 641. An electron traveling along optical axis 602 with energy>$V_0$ can be incident at beam separator 510 with an incident angle<angle 641. An electron traveling along optical axis 602 with energy<$V_0$ can be incident at beam separator 510 with an incident angle>angle 641.

Beam separator 510 can deflect primary electron beam 210 with a nominal deflection angle 642 and an associated beam dispersion MDS. An electron with nominal energy $V_0$ can be deflected at deflection plane 520 by an angle 642. An electron with energy>$V_0$ can be deflected at an angle less than angle 642. An electron with energy<$V_0$ can be deflected at an angle greater than angle 642.

The CDS generated by dispersion device 312 can be controlled wherein the incident angle variation generated by CDS for electrons with different energies can compensate the deflection angle variation generated by MDS. Accordingly, the electrons with different energies can be controlled to virtually focus on object plane 204. Further, objective lens 228 can focus the electrons with different energies (corresponding to beam paths 630, 632, and 634) onto sample 238 to form probe spot 236. Dispersion device 312 comprises an electrostatic deflector and a magnetic deflector and the CDS can therefore be varied while maintaining deflection angle 641 constant. Therefore the CDS can be changed to match the position variation of object plane 204 and no restrictions are placed on operation modes of objective lens 228. Further dispersion device 312 can be controlled to maintain angles 641 and 642 equal. So optical axis 602 can be maintained parallel to optical axis of beam separator 510. This can simplify the arrangement and alignment of various components of single-beam apparatus 600.

Figure 7:
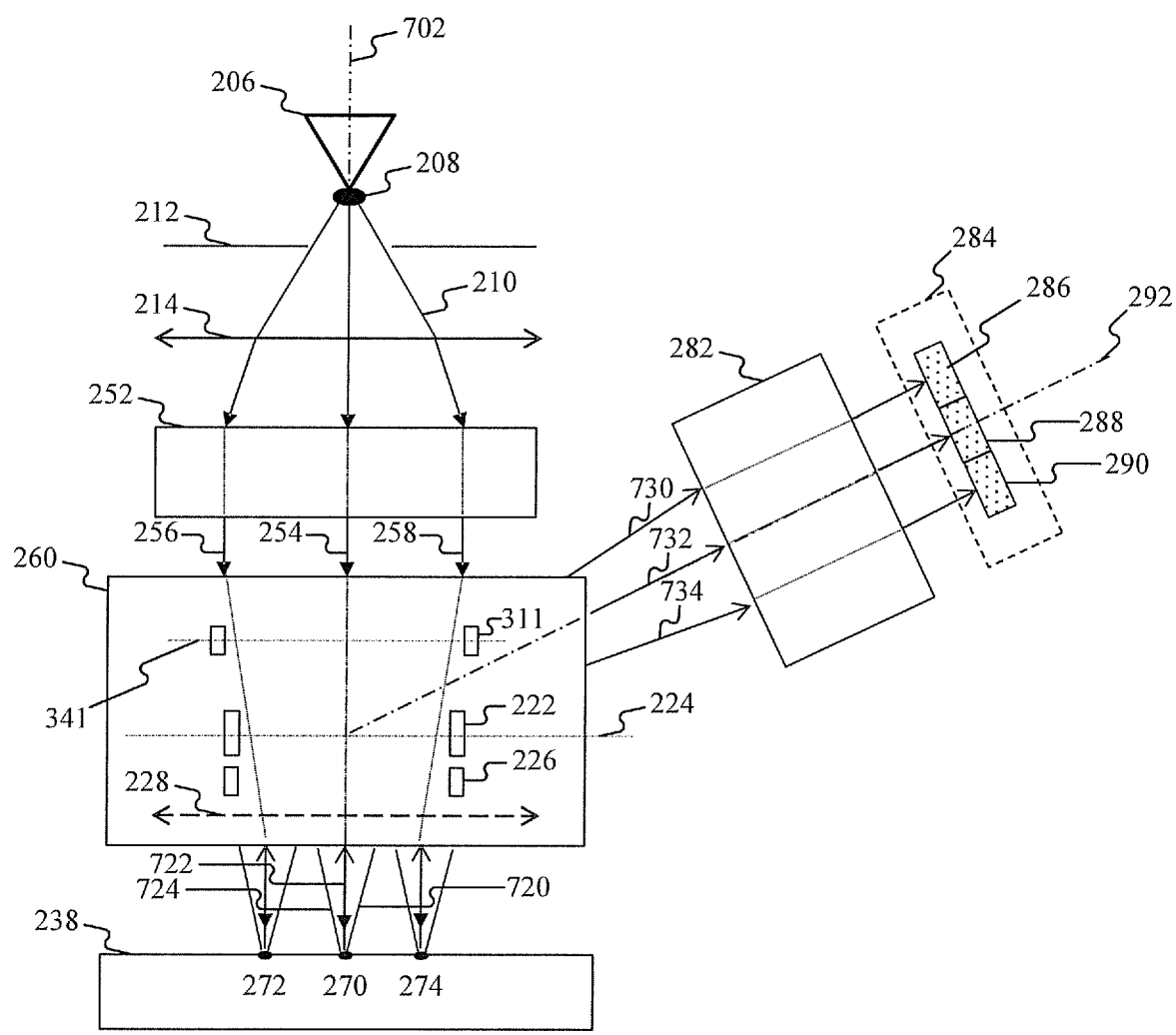
FIG. 7 is a schematic diagram illustrating an exemplary multi-beam apparatus, consistent with embodiments of the present disclosure.

Reference is now made to FIG. 7, which illustrates an exemplary multi-beam apparatus 700, consistent with embodiments of the present disclosure. Multi-beam apparatus 700 can be electron beam tool 104A of FIG. 2B further comprising dispersion device 311 of FIG. 3B.

Multi-beam apparatus 700 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 730, 732, and 734, secondary optical system 282, and electron detection device 284. Primary projection optical system 260 can comprise objective lens 228. Electron detection device 284 can comprise detection elements 286, 288, and 290. Dispersion device 311, beam separator 222 and deflection scanning unit 226 can be placed inside primary projection optical system 260.

Electron source 206, gun aperture 212, condenser lens 214, source conversion unit 252, dispersion device 311, beam separator 222, deflection scanning unit 226, and objective lens 228 can be aligned with a primary optical axis 702 of apparatus 700. Secondary optical system 282 and electron detection device 284 can be aligned with a secondary optical axis 292 of apparatus 700.

As described above with reference to FIG. 3B, the nominal dispersion angle associated with dispersion device 311 is zero and beamlets 254, 256, and 258 can pass straight through dispersion device 311. Dispersion device 311 can induce a CDS for beamlets 254, 256, and 258. Dispersion device 311 can be placed above primary projection optical system 260.

Beamlets 254, 256, and 258 can also pass straight through beam separator 222 of Wien filter type. Beam separator 222 can induce a MDS for the beamlets. As described above with reference to FIG. 4A and FIG. 4B, dispersion device 311 can be configured and controlled to generate CDS opposite in direction to the MDS. The magnitude of CDS generated by dispersion device 311 can be controlled to make dispersed electrons of each beamlet (for example, electrons corresponding to beam paths 720 and 724) virtually focus on object plane of objective lens 228. Accordingly, objective lens 228 focuses the dispersed electrons of beamlets 254, 256, and 258 onto sample 238 to form corresponding probe spots 270, 272, and 274.

Figure 8:
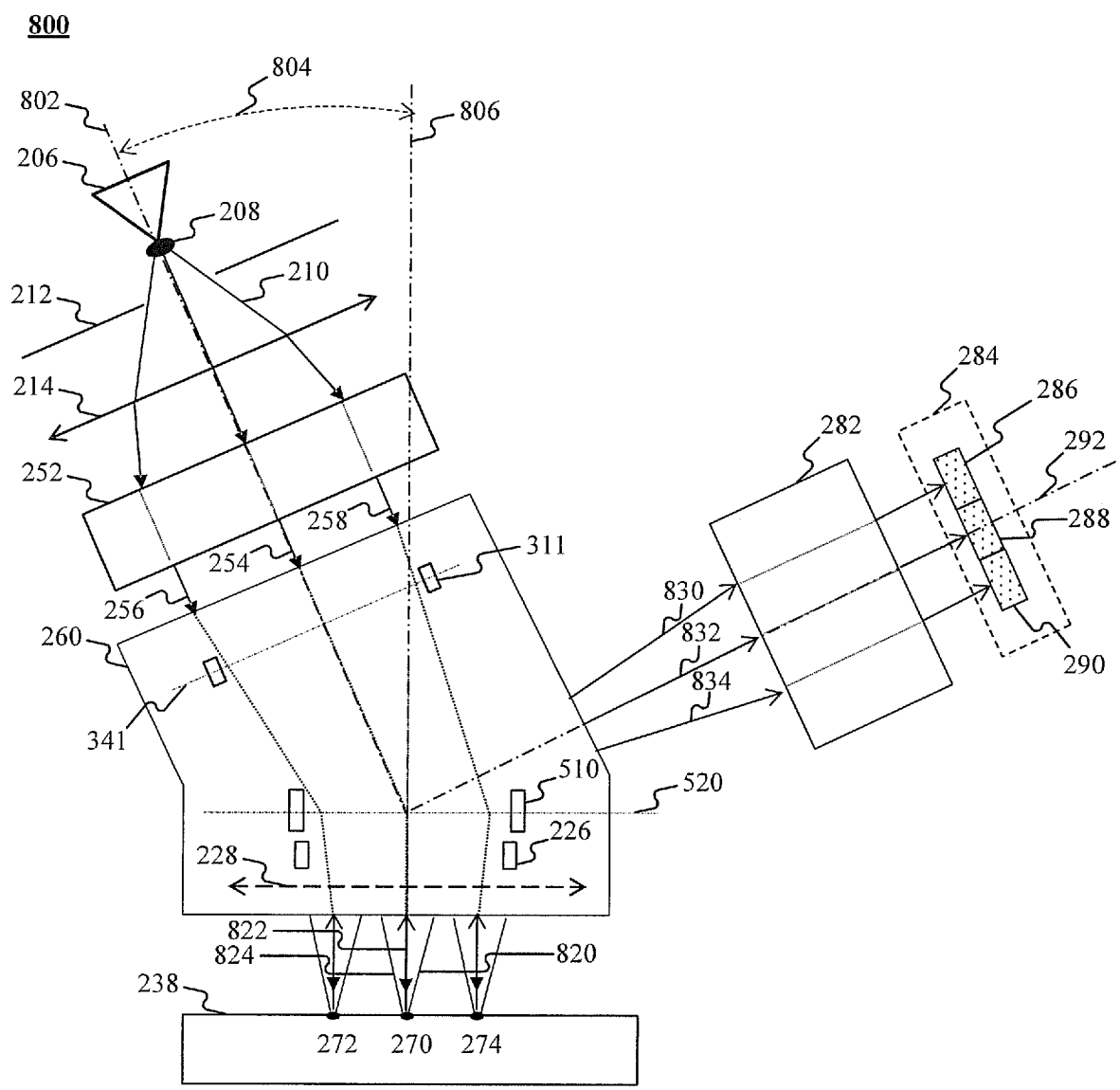
FIG. 8 is a schematic diagram illustrating an exemplary multi-beam apparatus, consistent with embodiments of the present disclosure.

Reference is now made to FIG. 8, which illustrates an exemplary multi-beam apparatus 800, consistent with embodiments of the present disclosure. Multi-beam apparatus 800 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 830, 832, and 834, secondary optical system 282, and electron detection device 284. Primary projection optical system 260 can comprise objective lens 228. Electron detection device 284 can comprise detection elements 286, 288, and 290. Dispersion device 311, beam separator 510 and deflection scanning unit 226 can be placed inside primary projection optical system 260.

Electron source 206, gun aperture 212, condenser lens 214, source conversion unit 252, dispersion device 311, beam separator 510, deflection scanning unit 226, and objective lens 228 can be aligned with a primary optical axis 802 of apparatus 800. Secondary optical system 282 and electron detection device 284 can be aligned with a secondary optical axis 292 of apparatus 800.

As described above with reference to FIG. 3B, the nominal dispersion angle associated with dispersion device 311 is zero and beamlets 254, 256, and 258 can pass straight through dispersion device 311. Dispersion device 311 can induce a CDS for beamlets 254, 256, and 258. Dispersion device 311 can be placed above primary projection optical system 260.

Beam separator 510 can deflect beamlets 254, 256, and 258 with a nominal deflection angle equal to angle 804 and an associated beam dispersion MDS. An electron with nominal energy $V_0$ can be deflected at an angle equal to angle 804. An electron with energy>$V_0$ can be deflected at an angle less than angle 804. An electron with energy<$V_0$ can be deflected at an angle greater than angle 804.

The CDS generated by dispersion device 311 can be controlled wherein the incident angle variation generated by CDS for electrons with different energies can compensate the deflection angle variation generated by MDS. Accordingly, the electrons with different energies can be controlled to virtually focus on the object plane of objective lens 228. Further, objective lens 228 can focus the electrons with different energies (corresponding to beam paths 820, 822, and 824) onto sample 238 to form corresponding probe spots 270, 272, and 274.

Figure 9:
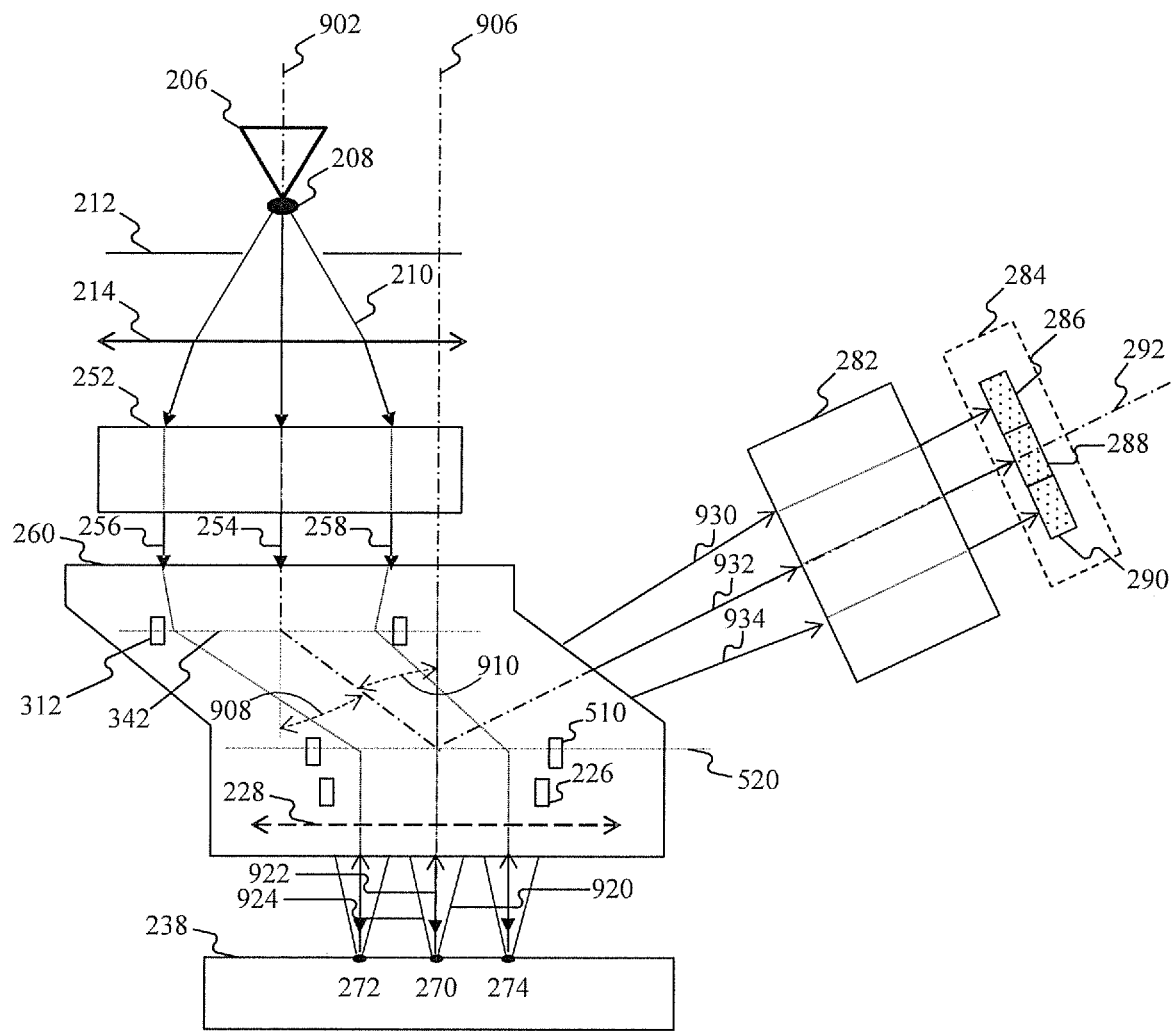
FIG. 9 is a schematic diagram illustrating an exemplary multi-beam apparatus, consistent with embodiments of the present disclosure.

Reference is now made to FIG. 9, which illustrates an exemplary multi-beam apparatus 900, consistent with embodiments of the present disclosure. Multi-beam apparatus 900 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 930, 932, and 934, secondary optical system 282, and electron detection device 284. Primary projection optical system 260 can comprise objective lens 228. Electron detection device 284 can comprise detection elements 286, 288, and 290. Dispersion device 312, beam separator 510 and deflection scanning unit 226 can be placed inside primary projection optical system 260.

Electron source 206, gun aperture 212, condenser lens 214, source conversion unit 252, dispersion device 312, beam separator 510, deflection scanning unit 226, and objective lens 228 can be aligned with a primary optical axis 902 of apparatus 900. Secondary optical system 282 and electron detection device 284 can be aligned with a secondary optical axis 292 of apparatus 900.

As described above with reference to FIG. 3C, the nominal dispersion angle associated with dispersion device 312 is non-zero and primary electron beam 210 can pass through dispersion device 312 with a nominal deflection angle 908 and with an associated beam dispersion CDS. An electron of beamlets 254, 256, and 258 traveling along optical axis 902 with nominal energy $V_0$ can be incident at beam separator 510 with an incident angle 908. An electron traveling along optical axis 902 with energy>$V_0$ can be incident at beam separator 510 with an incident angle<angle 908. An electron traveling along optical axis 902 with energy<$V_0$ can be incident at beam separator 510 with an incident angle>angle 908. Dispersion device 312 can be placed above primary projection optical system 260.

Beam separator 510 can deflect beamlets 254, 256, and 258 with a nominal deflection angle equal to angle 910 and an associated beam dispersion MDS. An electron with nominal energy $V_0$ can be deflected at an angle equal to angle 910. An electron with energy>$V_0$ can be deflected at an angle less than angle 910. An electron with energy<$V_0$ can be deflected at an angle greater than angle 910.

The CDS generated by dispersion device 312 can be controlled wherein the incident angle variation generated by CDS for electrons with different energies can compensate the deflection angle variation generated by MDS. Accordingly, the electrons with different energies can be controlled to virtually focus on the object plane of objective lens 228. Further, objective lens 228 can focus the electrons with different energies (corresponding to beam paths 920, 922, and 924) onto sample 238 to form corresponding probe spots 270, 272, and 274. Dispersion device 312 comprises an electrostatic deflector and a magnetic deflector and the CDS can therefore be varied while maintaining deflection angle 908 constant. Therefore the CDS can be changed to match the position variation of object plane 204 and no restrictions are placed on operation modes of objective lens 228. Further dispersion device 312 can be controlled to maintain that angles 908 and 910 are equal. So optical axis 902 can be maintained parallel to optical axis 906 of beam separator 510. This can simplify the arrangement and alignment of various components of single-beam apparatus 900.

Figure 10:
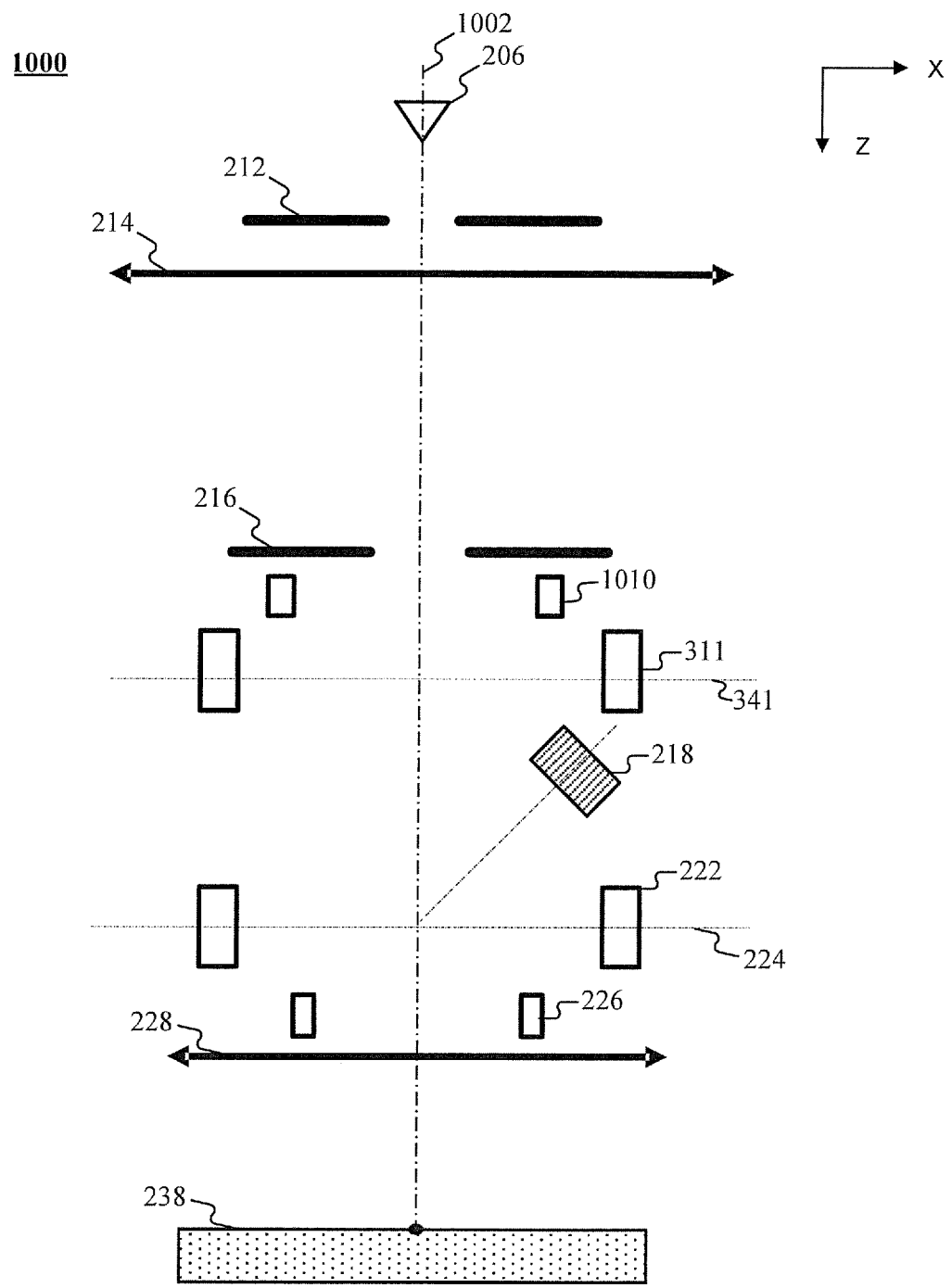
FIG. 10 is a schematic diagram illustrating an exemplary single-beam apparatus, consistent with embodiments of the present disclosure.

Reference is now made to FIG. 10, which illustrates an exemplary single-beam apparatus 1000, consistent with embodiments of the present disclosure. Single-beam apparatus 1000 can comprise electron source 206, gun aperture 212, condenser lens 214, beam-limit aperture 216, a multi-pole lens 1010, dispersion device 311, beam separator 222, deflection scanning unit 226, objective lens 228, and electron detector 218. Electron source 206, gun aperture 212, condenser lens 214, beam-limit aperture 216, multi-pole lens 1010, dispersion device 311, beam separator 222, deflection scanning unit 226, and objective lens 228 can be aligned with optical axis 1002 of single-beam apparatus 1000. Multi-pole lens 1010 can be configured to generate a quadrupole field to cancel the impacts of one or both of the astigmatism aberrations caused by beam separator 222 and dispersion device 311 on the primary beam probe spot. Multi-pole lens 1010 can be placed at different locations between electron source 206 and sample 238. In some embodiments, multi-pole lens 1010 can be placed adjacent to beam separator 222. In some embodiments, multi-pole lens 1010 can be placed adjacent to dispersion device 311.

In some embodiments, one or both of the electrostatic deflector and the magnetic defector of the dispersion device can comprise a multi-pole structure configured to generate a quadrupole field to cancel the impacts of astigmatism aberrations. As an example, dispersion device 311 of FIG. 3B, FIG. 4A-B, FIG. 5, FIG. 7, FIG. 8, or FIG. 10 can comprise a quadrupole field. In other examples, dispersion device 312 of FIG. 6, or FIG. 9 can comprise a quadrupole field.

In some embodiments, one or both of the electrostatic deflector and the magnetic defector of the beam separator can comprise a multi-pole structure configured to generate a quadrupole field to cancel the impacts of astigmatism aberrations. As an example, beam separator 222 of FIG. 4, FIG. 7, or FIG. 10 can comprise a quadrupole field. In other examples, beam separator 510 of FIG. 5, FIG. 6, FIG. 8 or FIG. 9 can comprise a quadrupole field.

In some embodiments, one of the image-forming elements within the source conversion unit can comprise a multi-pole structure configured to generate a quadrupole field to cancel the impacts of astigmatism aberrations. For example, the image-forming elements within source conversion unit 252 of FIG. 7, FIG. 8, or FIG. 9 can comprise a quadrupole field.

In some embodiments, the source conversion unit can comprise an array of image-compensation elements. One of the image-compensation elements can comprise a multi-pole structure configured to generate a quadrupole field to cancel the impacts of astigmatism aberrations. For example, the image-compensation elements within source conversion unit 252 of FIG. 7, FIG. 8, or FIG. 9 can comprise a quadrupole field.

Figure 11:
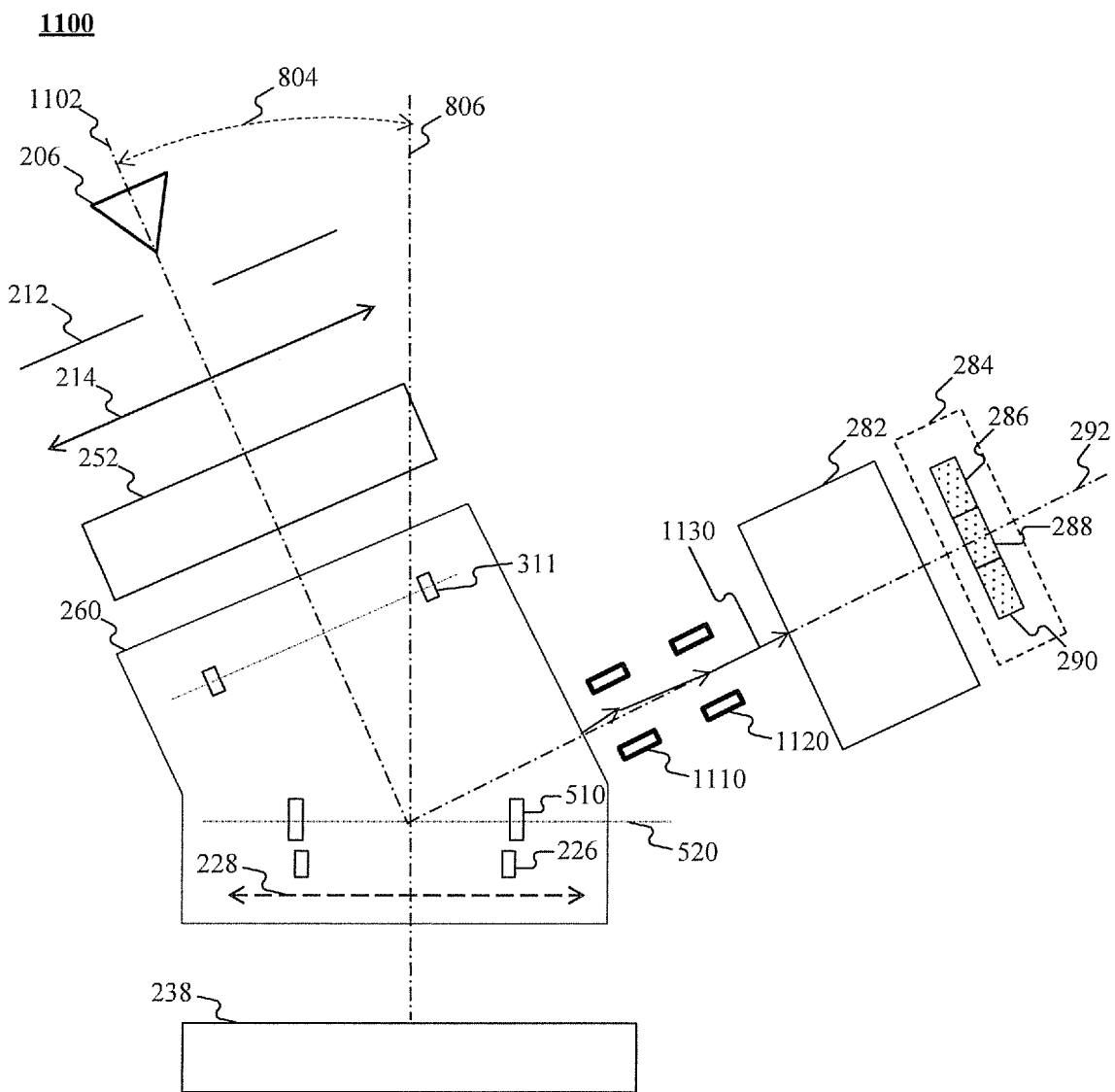
FIG. 11 is a schematic diagram illustrating an exemplary multi-beam apparatus, consistent with embodiments of the present disclosure.

Reference is now made to FIG. 11, which illustrates an exemplary multi-beam apparatus 1100, consistent with embodiments of the present disclosure. Multi-beam apparatus 1100 can be multi-beam apparatus 800 of FIG. 8 further comprising a first secondary deflector 1110 and a second secondary deflector 1120. In some embodiments, secondary deflector 1110 can be an electrostatic deflector. In other embodiments, secondary deflector 1110 can be a magnetic deflector. In some embodiments, secondary deflector 1120 can be an electrostatic deflector. In other embodiments, secondary deflector 1120 can be a magnetic deflector.

Multi-beam apparatus 1100 can comprise electron source 206, gun aperture 212, condenser lens 214, source conversion unit 252, primary projection optical system 260, secondary deflector 1110, secondary deflector 1120, secondary optical system 282, and electron detection device 284. Primary projection optical system 260 can comprise objective lens 228. Electron detection device 284 can comprise detection elements 286, 288, and 290. Dispersion device 311, beam separator 510 and deflection scanning unit 226 can be placed inside primary projection optical system 260.

Electron source 206, gun aperture 212, condenser lens 214, source conversion unit 252, dispersion device 311, beam separator 510, deflection scanning unit 226, and objective lens 228 can be aligned with a primary optical axis 1102 of apparatus 1100. Secondary optical system 282 and electron detection device 284 can be aligned with a secondary optical axis 292 of apparatus 1100. Secondary deflector 1110 and secondary deflector 1120 can be arranged between beam separator 510 and electron detection device 284. In some embodiments, secondary deflector 1110 and secondary deflector 1120 can be configured to adjust at least one of a position and an angle of secondary charged particle beam 1130 incident on the detector.

Figure 12:
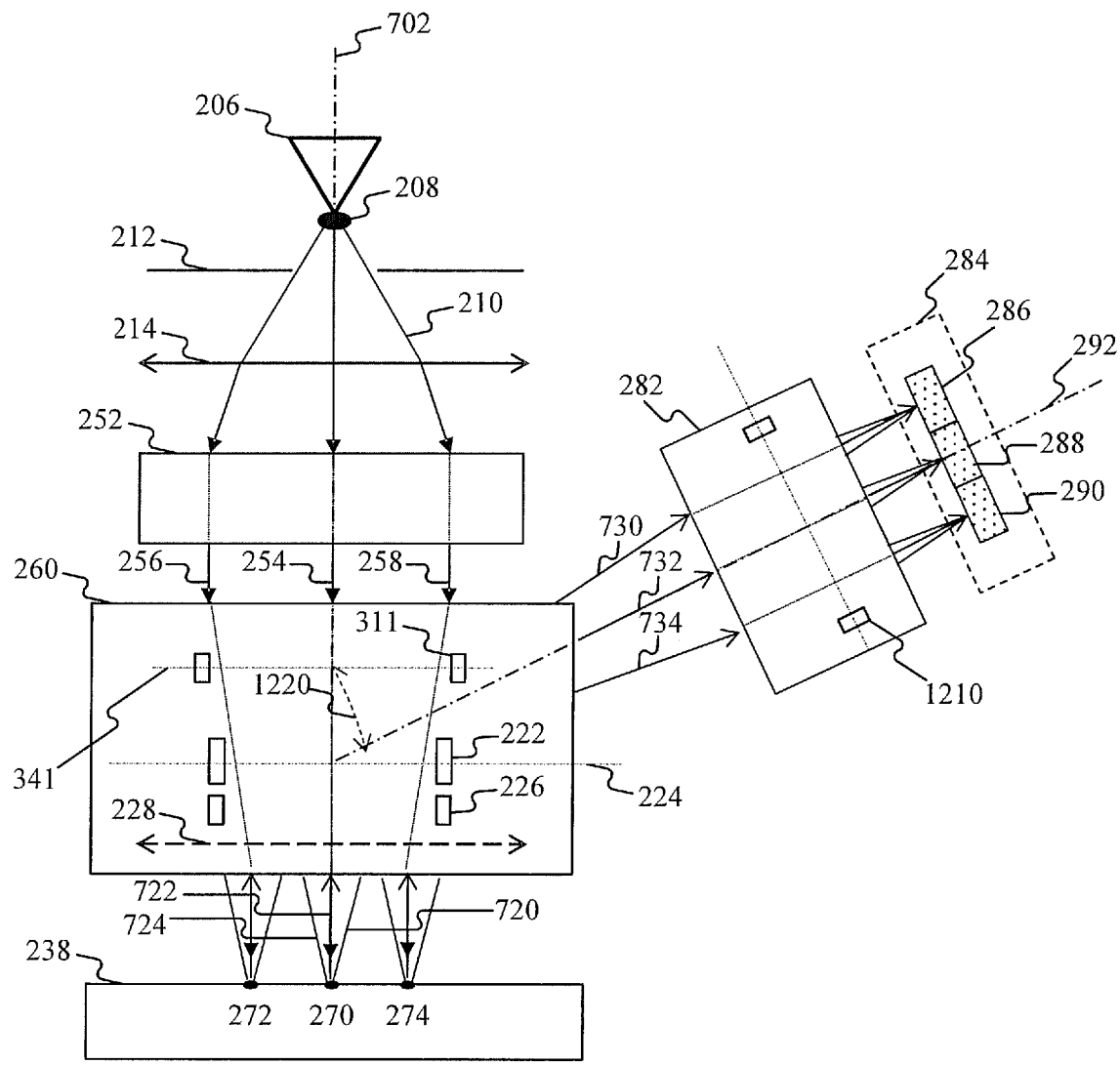
FIG. 12 is a schematic diagram illustrating an exemplary multi-beam apparatus, consistent with embodiments of the present disclosure.

Reference is now made to FIG. 12, which illustrates an exemplary multi-beam apparatus 1200, consistent with embodiments of the present disclosure. Multi-beam apparatus 1200 can be multi-beam apparatus 700 of FIG. 7, further comprising dispersion device 1210.

Multi-beam apparatus 1200 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 730, 732, and 734, secondary optical system 282, and electron detection device 284. Primary projection optical system 260 can comprise objective lens 228. Dispersion device 311, beam separator 222 and deflection scanning unit 226 can be placed inside primary projection optical system 260. Electron detection device 284 can comprise detection elements 286, 288, and 290. In some embodiments, dispersion device 1210 can be placed between beam separator 222 and secondary optical system 282. In other embodiments, dispersion device 1210 can be placed between electron detection device 284 and secondary optical system 282. Dispersion device 1210 can be similar to dispersion device 311 of FIG. 3B.

Electron source 206, gun aperture 212, condenser lens 214, source conversion unit 252, dispersion device 311, beam separator 222, deflection scanning unit 226, and objective lens 228 can be aligned with a primary optical axis 702 of apparatus 1200. Secondary optical system 282 and electron detection device 284 can be aligned with a secondary optical axis 292 of apparatus 700.

The nominal deflection angle of secondary beams 730, 732, and 734 associated with beam separator 222 is non-zero and the secondary beams can pass through beam separator 222 with a nominal deflection angle 1220 and with an associated beam dispersion MDS_2. An electron of secondary electron beam 730, 732, or 734 traveling along optical axis 702 with nominal energy $V_s$ can be incident at secondary optical system 282 with an incident angle of zero. An electron traveling along optical axis 702 with energy>$V_s$ can be incident at secondary optical system 282 with an incident angle<zero (clockwise to axis 292). An electron traveling along optical axis 702 with energy<$V_s$ can be incident at secondary optical system 282 with an incident angle>zero (anti-clockwise to axis 292).

Dispersion device 1210 can deflect secondary electron beams 730, 732, and 734 with a nominal deflection angle equal to zero and associated beam dispersion CDS_2. An electron with nominal energy $V_s$ is not deflected by dispersion device 1210. An electron with energy>$V_s$ can be deflected clockwise while an electron with energy<$V_0$ can be deflected anticlockwise.

The CDS_2 generated by dispersion device 1210 can be controlled to compensate the deflection angle variation associated with MDS_2. Accordingly, the electrons with different energies can be controlled to virtually focus on object plane of downstream lens of secondary optical system 282 and can form corresponding beam spots at detection elements 286, 288, and 290.

Figure 13:
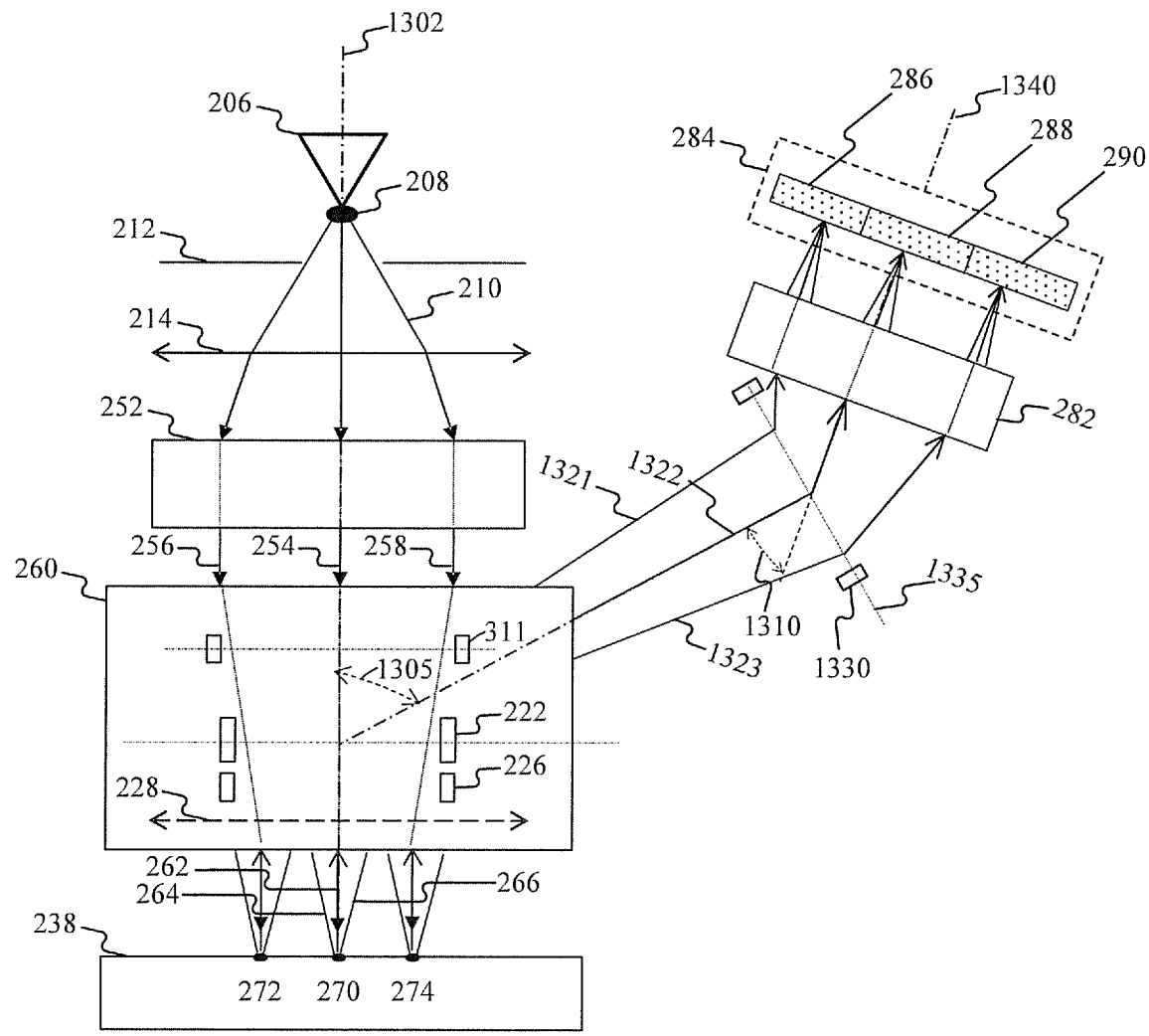
FIG. 13 is a schematic diagram illustrating an exemplary multi-beam apparatus, consistent with embodiments of the present disclosure.

Reference is now made to FIG. 13, which illustrates an exemplary multi-beam apparatus 1300, consistent with embodiments of the present disclosure. Multi-beam apparatus 1300 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 1321, 1322, and 1323, a dispersion device 1330, secondary optical system 282, and electron detection device 284. Primary projection optical system 260 can comprise objective lens 228. Dispersion device 311, beam separator 222 and deflection scanning unit 226 can be placed inside primary projection optical system 260. Electron detection device 284 can comprise detection elements 286, 288, and 290. In some embodiments, dispersion device 1330 can be placed between beam separator 222 and secondary optical system 282 (as shown in FIG. 13). In other embodiments, dispersion device 1330 can be placed inside secondary system 282. In other embodiments, dispersion device 1330 can be placed between electron detection device 284 and secondary optical system 282. Dispersion device 1330 can be similar to dispersion device 312 of FIG. 3C.

Electron source 206, gun aperture 212, condenser lens 214, source conversion unit 252, dispersion device 311, beam separator 222, deflection scanning unit 226, and objective lens 228 can be aligned with a primary optical axis 1302 of apparatus 1300. Secondary optical system 282 and electron detection device 284 can be aligned with a secondary optical axis 1340 of apparatus 1300.

The nominal deflection angle of secondary beams 1321, 1322, and 1323 associated with beam separator 222 is non-zero angle 1305 and the secondary beams can pass through beam separator 222 with a nominal deflection angle 1305 and with an associated beam dispersion MDS_2. An electron of secondary electron beam 1321, 1322, and 1323 traveling along optical axis 1302 with nominal energy $V_s$ can be incident at dispersion device 1330 with an incident angle of zero. An electron traveling along optical axis 1302 with energy>$V_s$ can be incident at dispersion device 1330 with an incident angle<zero (clockwise to axis 1340). An electron traveling along optical axis 1302 with energy<$V_s$ can be incident at dispersion device 1330 with an incident angle>zero (anti-clockwise to axis 1340).

Dispersion device 1330 can deflect secondary electron beams 1321, 1322, and 1323 with a nominal non-zero deflection angle 1310 and associated beam dispersion CDS_2. An electron with nominal energy Vs is deflected by dispersion device 1330 at an angle 1310. An electron with energy>$V_s$ can be deflected at an angle less than 1310 and an electron with energy<$V_0$ can be deflected at an angle greater than 1310.

The CDS_2 generated by dispersion device 1330 can be controlled to compensate the deflection angle variation associated with MDS_2. The CDS_2 can be controlled to make the electrons with different energies deflect at very similar angles after exiting dispersion device 1330 and focus on the object plane of the first lens inside secondary optical system 282. Accordingly, the electrons with different energies can be controlled to converge and form beam spots at detection elements 286, 288, and 290.

Figure 14:
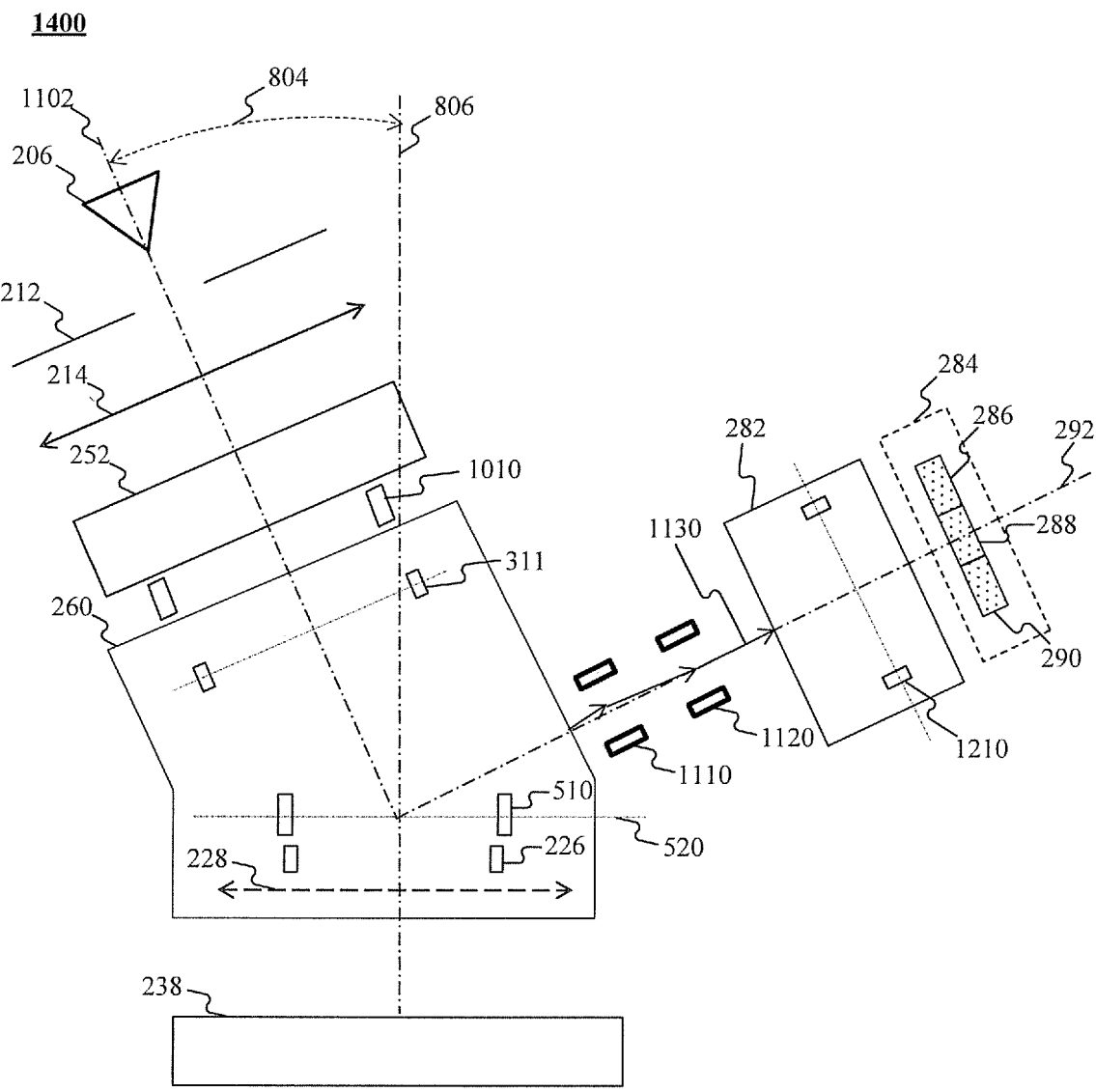
FIG. 14 is a schematic diagram illustrating an exemplary multi-beam apparatus, consistent with embodiments of the present disclosure.

Reference is now made to FIG. 14, which illustrates an exemplary multi-beam apparatus 1400, consistent with embodiments of the present disclosure. Multi-beam apparatus 1100 can be multi-beam apparatus 1100 of FIG. 11 further comprising multi-pole lens 1010 and dispersion device 1210.

Multi-beam apparatus 1400 can comprise electron source 206, gun aperture 212, condenser lens 214, source conversion unit 252, multi-pole lens 1010, primary projection optical system 260, secondary deflector 1110, secondary deflector 1120, secondary optical system 282, and electron detection device 284. Primary projection optical system 260 can comprise objective lens 228. Electron detection device 284 can comprise detection elements 286, 288, and 290.

Electron source 206, gun aperture 212, condenser lens 214, source conversion unit 252, multi-pole lens 1010, dispersion device 311, beam separator 510, deflection scanning unit 226, and objective lens 228 can be aligned with a primary optical axis 1102 of apparatus 1400. Secondary optical system 282 and electron detection device 284 can be aligned with a secondary optical axis 292 of apparatus 1100. Secondary deflector 1110 and secondary deflector 1120 can be arranged between beam separator 510 and electron detection device 284.

Dispersion device 311 can be configured to compensate dispersion of a beamlet of the primary electron beam caused by beam separator 510. The quadrupole field of multi-pole lens 1010 can be configured to compensate astigmatism aberrations of the beamlet introduced by dispersion device 311 and beam separator 510. Secondary deflector 1110 and secondary deflector 1120 can be configured to adjust at least one of a position and an angle of a secondary charged particle beam 1130. Dispersion device 1210 can be configured to compensate dispersion of the secondary electron beam caused by beam separator 510.

Figure 15:
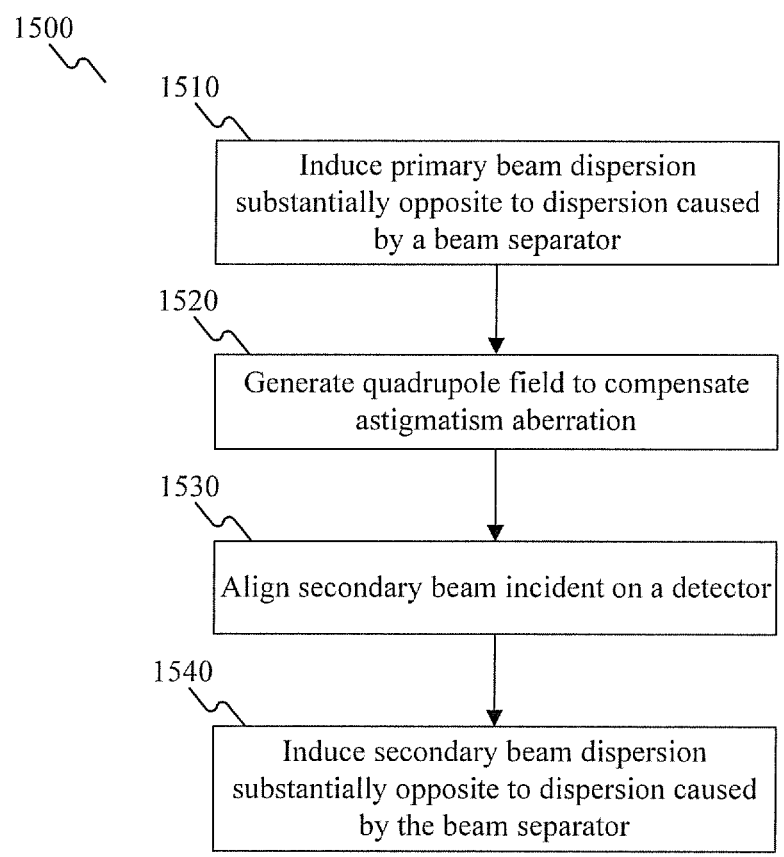
FIG. 15 is a flowchart illustrating an exemplary method for controlling dispersion in a charged particle beam system, consistent with embodiments of the present disclosure.

FIG. 15 is a flowchart illustrating an exemplary method 1500 for controlling dispersion in a charged particle beam system with a beam separator, consistent with embodiments of the present disclosure. As an example, method 1500 can be performed by multi-beam apparatus 1400 of FIG. 14 or any of the other disclosed beam apparatuses. It will be readily appreciated that the illustrated procedure can be altered to modify the order of steps, delete steps, or further include additional steps.

After an initial start, a dispersion device (e.g., dispersion device 311 of multi-beam apparatus 1400) induces dispersion in a primary beam of the charged particle beam system, in step 1510. The induced dispersion can be substantially opposite to a dispersion of the primary beam caused by the beam separator.

In step 1520, a multi-pole lens (e.g., multi-pole lens 1010 of multi-beam apparatus 1400) can generate a quadrupole field to compensate astigmatism aberrations introduced by the dispersion device and the beam separator. In some embodiments, the multi-pole lens can be included within the dispersion device or the beam separator.

In step 1530, one or more secondary deflectors (e.g., secondary deflector 1110 and secondary deflector 1120) can adjust the position or angle of a secondary electron beam incident on a detector. In some embodiments, the secondary deflectors can be electrostatic deflectors. In other embodiments, the secondary deflectors can be magnetic deflectors.

In step 1540, a dispersion device (e.g., dispersion device 1210 of multi-beam apparatus 1400) induces dispersion in a secondary beam of the charged particle beam system. The induced dispersion can be substantially opposite to a dispersion of the secondary beam caused by the beam separator.

The embodiments may further be described using the following clauses:

1. A dispersion device for a charged particle beam system with a beam separator, the dispersion device comprising:

an electrostatic deflector and a magnetic deflector configured for inducing a first beam dispersion to a charged particle beam of the system, wherein the first beam dispersion is set to cancel an impact of a second beam dispersion of the beam caused by the beam separator, wherein the electrostatic deflector exerts a first force on the beam and the magnetic deflector exerts a second force on the beam, and the first force and the second force are substantially opposite to each other and form the first beam dispersion.

2. The dispersion device of clause 1, wherein a deflection angle of the beam due to the dispersion device is unchanged when the first beam dispersion is changed with respect to the second beam dispersion.

3. The dispersion device of clause 2, wherein the deflection angle is zero.

4. The dispersion device of clause 1, further comprising a multi-pole lens which can generate a quadrupole field to cancel an impact of an astigmatism aberration caused by the first force and the second force.

5. The dispersion device of clause 1, wherein the charged particle beam is an electron beam.

6. The dispersion device of any one of clauses 1-5, wherein the charged particle beam system comprises an electron beam inspection tool.

7. A charged particle beam apparatus comprising:

a source for generating a primary charged particle beam;

a first dispersion device below the source;

a beam separator below the first dispersion device;

an objective lens below the beam separator;

a sample stage for supporting a sample; and a detector above the beam separator, wherein the primary charged particle beam is focused by the objective lens onto the sample, forms a primary probe spot thereon and generates a secondary charged particle beam therefrom, wherein the beam separator separates the primary charged particle beam and the secondary charged particle beam so that the secondary charged particle beam is detected by the detector, wherein the first dispersion device generates a first primary beam dispersion to the primary charged particle beam and the beam separator generates a second primary beam dispersion to the primary charged particle beam and a second secondary beam dispersion to the secondary charged particle beam, wherein the first dispersion device comprises a first electrostatic deflector and a first magnetic deflector respectively exerting a first force and a second force on the primary charged particle beam, and the first force and the second force are opposite to each other and form the first primary beam dispersion, wherein the first primary beam dispersion is adjusted to make the first primary beam dispersion cancel an impact of the second primary beam dispersion on the primary probe spot.

8. The charged particle beam apparatus of clause 7, wherein the beam separator comprises a second magnetic deflector.

9. The charged particle beam apparatus of clause 8, wherein a first deflection angle of the primary charged particle beam caused by the first dispersion device is equal and opposite to a second deflection angle of the primary charged particle beam caused by the beam separator.

10. The charged particle beam apparatus of clause 8, wherein a first deflection angle of the primary charged particle beam caused by the first dispersion device is zero.

11. The charged particle beam apparatus of clause 7, wherein the beam separator comprises a Wien filter.

12. The charged particle beam apparatus of clause 11, wherein a first deflection angle of the primary charged particle beam caused by the first dispersion device is zero.

13. The charged particle beam apparatus of clause 7, further comprising one or more secondary deflectors which are between the beam separator and the detector, and configured to adjust at least one of a position and an angle of the secondary charged particle beam incident on the detector.

14. The charged particle beam apparatus of clause 7, further comprising a first multi-pole lens configured to generate a quadrupole field to cancel at least one of impacts of astigmatism aberrations caused by the beam separator and the first dispersion device on the primary probe spot.

15. The charged particle beam apparatus of clause 14, wherein the first multi-pole lens is placed adjacent to one of the beam separator and the first dispersion device.

16. The charged particle beam apparatus of any one of clauses 7 and 14, wherein the beam separator comprises a second multi-pole lens configured to generate a quadrupole field to cancel at least one of impacts of astigmatism aberrations caused by the beam separator and the first dispersion device on the primary probe spot.

17. The charged particle beam system of any one of clauses 7, 14 and 16, wherein the first dispersion device comprises a third multi-pole lens configured to generate a quadrupole field to cancel at least one of impacts of astigmatism aberrations caused by the beam separator and the first dispersion device on the primary probe spot.

18. The charged particle beam system of any one of clauses 7 and 13, further comprising a second dispersion device which is between the beam separator and a detector and generates a first secondary beam dispersion to the secondary charged particle beam, the second dispersion device comprising: a third electrostatic deflector and a third magnetic deflector, wherein deflection fields thereof are adjusted to make the first secondary beam dispersion cancel an impact of the second secondary beam dispersion on a secondary probe spot of the secondary charged particle beam on the detector.

19. The charged particle beam system of clause 7, wherein the charged particle beam is an electron beam.

20. A method for controlling dispersion in a charged particle beam system with a beam separator, comprising:

providing a first dispersion device in a path of a primary charged particle beam of the system;

placing the first dispersion device upstream of the beam separator;

generating a first primary beam dispersion to the primary charged particle beam by the first dispersion device; and adjusting the first primary beam dispersion to cancel an impact of a second primary beam dispersion of the primary charged particle beam caused by the beam separator, wherein the first dispersion device comprises a first electrostatic deflector and a first magnetic deflector respectively exerting a first force and a second force on the primary charged particle beam, and the first force and the second force are opposite to each other and form the first primary beam dispersion.

21. The method of clause 20, further comprising:

providing one or more secondary deflectors arranged along a path of a secondary charged particle beam between the beam separator and a detector, wherein the secondary charged particle beam is generated from a sample by the primary charged particle beam.

22. The method of clause 21, further comprising:

operating the one or more secondary deflectors to adjust at least one of a position and an angle of the secondary charged particle beam incident on the detector.

23. The method of clause 20, further comprising:

providing one multi-pole lens which generates a quadrupole field to cancel at least one of astigmatism aberrations caused by the beam separator and the first dispersion device.

24. The method of clause 20, further comprising:

providing a second dispersion device generating a first secondary beam dispersion to a secondary charged particle beam of the system, wherein the secondary charged particle beam is generated from a sample by the primary charged particle beam, the second dispersion device comprises a second electrostatic deflector and a second magnetic deflector respectively exerting a third force and a fourth force on the secondary charged particle beam, and the third force and the fourth force are opposite to each other and form the first secondary beam dispersion.

25. The method of clause 24, further comprising:

adjusting the first secondary beam dispersion to cancel an impact of a second secondary beam dispersion of the secondary charged particle beam caused by the beam separator.

26. A charged particle beam apparatus comprising:
a source configured to provide a primary charged particle beam;
a source conversion unit configured to form a plurality of parallel images of the source using a plurality of beamlets of the primary charged particle beam;
a first projection system with an objective lens and configured to project the plurality of parallel images onto a sample and therefore form a plurality of primary probe spots thereon with the plurality of beamlets;
a beam separator configured to separate the plurality of beamlets and a plurality of secondary charged particle beams generated from the sample by the plurality of primary probe spots;
a detection device with a plurality of detection elements;
a secondary projection system configured to focus the plurality of secondary charged particle beams onto the detection device and form a plurality of secondary probe spots thereon, and the plurality of secondary probe spots are detected by the plurality of detection elements; and
a first dispersion device arranged upstream of the beam separator and configured to generate a plurality of first primary beam dispersions to the plurality of beamlets, wherein the plurality of first primary beam dispersions is adjusted to cancel impacts of a plurality of second primary beam dispersions generated by the beam separator to the plurality of primary probe spots,
wherein the first dispersion device comprises a first electrostatic deflector and a first magnetic deflector respectively exerting a first force and a second force on each of the plurality of beamlets, the first force and the second force are opposite to each other and form the corresponding first primary beam dispersion.

27. The charged particle beam apparatus of clause 26, wherein the beam separator comprises a second magnetic deflector.

28. The charged particle beam apparatus of clause 27, wherein a first deflection angle of one of the plurality of beamlets caused by the first dispersion device is zero.

29. The charged particle beam apparatus of clause 27 wherein a first deflection angle of one of the plurality of beamlets caused by the first dispersion device is equal and opposite to a second deflection angle of the one of plurality of beamlets caused by the beam separator.

30. The charged particle beam apparatus of clause 26, wherein the beam separator comprise a Wien Filter.

31. The charged particle beam apparatus of clause 30, wherein a first deflection angle of one of the plurality of beamlets caused by the first dispersion device is zero.

32. The charged particle beam apparatus of clause 26, further comprising one or more secondary deflectors which are between the beam separator and the secondary projection system, and configured to adjust at least one of a position and an angle of each of the plurality of secondary charged particle beams incident onto the secondary projection system.

33. The charged particle beam apparatus of clause 26, further comprising a first multi-pole lens configured to generate a quadrupole field to cancel impacts of astigmatism aberrations caused by at least one of the beam separator and the first dispersion device to the plurality of primary probe spots.

34. The charged particle beam apparatus of clause 33, wherein the first multi-pole lens is placed adjacent to one of the beam separator and the first dispersion device.

35. The charged particle beam apparatus of any one of clauses 26 and 33, wherein the beam separator comprises a second multi-pole lens configured to generate a quadrupole field to cancel impacts of astigmatism aberrations caused by at least one of the beam separator and the first dispersion device to the plurality of primary probe spots.

36. The charged particle beam system of any one of clauses 26, 33 and 35, wherein the first dispersion device comprises a third multi-pole lens configured to generate a quadrupole field to cancel impacts of astigmatism aberrations caused by at least one of the beam separator and the first dispersion device to the plurality of primary probe spots.

37. The charged particle beam system of any one of clauses 26, 33, 35, and 36, wherein the source conversion unit comprises a plurality of sixth multi-pole lenses each configured to generate a quadrupole field to cancel impacts of astigmatism aberrations caused by at least one of the beam separator and the first dispersion device to the corresponding primary probe spot.

38. The charged particle beam apparatus of clause 26, further comprising a fourth multi-pole lens configured to generate a quadrupole field to cancel impacts of astigmatism aberrations caused by the beam separator to the plurality of secondary probe spots.

39. The charged particle beam system of clause 26, further comprising a second dispersion device which is between the beam separator and the detection device and generates a plurality of first secondary beam dispersions to the plurality of secondary charged particle beams, the second dispersion device comprising:
a third electrostatic deflector and a third magnetic deflector, respectively exerting a third force and a fourth force on each of the plurality of secondary charged particle beams, the third force and the fourth force are opposite to each other and form the corresponding first secondary beam dispersion,
wherein the plurality of first secondary beam dispersions is adjusted to cancel impacts of a plurality of second secondary beam dispersions generated by the beam separator to the plurality of secondary probe spots.

40. The charged particle beam apparatus of clause 39, further comprising a fourth multi-pole lens configured to generate a quadrupole field to cancel impacts of astigmatism aberrations caused by at least one of the beam separator and the second dispersion device to the plurality of secondary probe spots.

41. The charged particle beam apparatus of any one of clauses 39 and 40, wherein the second dispersion device comprises a fifth multi-pole lens configured to generate a quadrupole field to cancel impacts of astigmatism aberrations caused by at least one of the beam separator and the second dispersion device to the plurality of secondary probe spots.

42. The charged particle beam system of clause 26, wherein the primary charged particle beam is an electron beam.

43. A method for controlling dispersion in a charged particle beam system with a beam separator, comprising:
providing a source conversion unit to form a plurality of images of a source by a plurality of beamlets of a primary charged particle beam generated by the source;
providing a first dispersion device in paths of the plurality of beamlets;
placing the first dispersion device upstream of the beam separator;
generating a plurality of first primary beam dispersions to the plurality of beamlets by the first dispersion device; and
adjusting the plurality of first primary beam dispersions to cancel impacts of a plurality of second primary beam dispersions generated by the beam separator to the plurality of beamlets,
wherein the first dispersion device comprises a first electrostatic deflector and a first magnetic deflector respectively exerting a first force and a second force on each of the plurality of beamlets, the first force and the second force are opposite to each other and form the corresponding first primary beam dispersion.

44. The method of clause 43, further comprising:
providing a second dispersion device generating a plurality of first secondary beam dispersions to a plurality of secondary charged particle beams of the system, wherein the plurality of secondary charged particle beams is generated from a sample by the plurality of beamlets, the second dispersion device comprises a second electrostatic deflector and a second magnetic deflector respectively exerting a third force and a fourth force on each of the plurality of secondary charged particle beams, and the third force and the fourth force are opposite to each other and form the corresponding first secondary beam dispersion.

45. The method of clause 44, further comprising:
adjusting the plurality of first secondary beam dispersions to cancel impacts of a plurality of second secondary beam dispersions generated by the beam separator on a plurality of secondary probe spots formed by the plurality of secondary charged particle beams on a detection device.

46. A dispersion filter for a charged particle beam system, the dispersion filter being arranged upstream of a beam separator of the charged particle beam system and comprising:
a combination of an electrostatic deflector and a magnetic deflector configured for inducing a first beam dispersion substantially opposite to a second beam dispersion caused by the beam separator.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A dispersion device for a charged particle beam system with a beam separator and an objective lens, the dispersion device comprising:
an electrostatic deflector and a magnetic deflector configured for inducing a first beam dispersion to a charged particle beam incident on a sample of the system, wherein the first beam dispersion is adjusted to cancel an impact of a second beam dispersion of the beam caused by the beam separator,
wherein the electrostatic deflector is configured to exert a first force on the charged particle beam and the magnetic deflector is configured to exert a second force on the charged particle beam, and the first force and the second force are substantially opposite to each other and form the first beam dispersion,
wherein a deflection angle of the beam caused by the dispersion device is unchanged when the first beam dispersion is changed with respect to the second beam dispersion, and
wherein an adjustment of the first beam dispersion causes an adjustment of a position of an object plane associated with the objective lens, the object plane being a virtual focal plane for a portion of charged particles of the charged particle beam.

2. The dispersion device of claim 1, wherein the deflection angle is zero.

3. The dispersion device of claim 1, further comprising a multi-pole lens which can generate a quadrupole field to cancel an impact of an astigmatism aberration caused by the first force and the second force.

4. The dispersion device of claim 1, wherein the charged particle beam is an electron beam.

5. The dispersion device of claim 1, wherein the charged particle beam system comprises an electron beam inspection tool.

6. The dispersion device of claim 1, wherein the adjustment of the first beam dispersion adjusts the position of the object plane between a first position and a second position, and wherein the object plane is located upstream from the objective lens in the first position and located downstream from the objective lens in the second position.

7. A charged particle beam apparatus comprising:
a source for generating a primary charged particle beam;
a first dispersion device below the source;
a beam separator below the first dispersion device;
an objective lens below the beam separator;
a sample stage for supporting a sample; and
a detector above the beam separator,
wherein the primary charged particle beam is focused by the objective lens onto the sample to form a primary probe spot thereon and generate a secondary charged particle beam therefrom,
wherein the beam separator is configured to separate the primary charged particle beam and the secondary charged particle beam so that the secondary charged particle beam is detected by the detector,
wherein the first dispersion device is configured to generate a first primary beam dispersion to the primary charged particle beam and the beam separator is configured to generate a second primary beam dispersion to the primary charged particle beam,
wherein the first dispersion device comprises a first electrostatic deflector and a first magnetic deflector, respectively configured to exert a first force and a second force on the primary charged particle beam, and wherein the first force and the second force are opposite to each other and form the first primary beam dispersion,
wherein the first primary beam dispersion is adjusted to make the first primary beam dispersion cancel an impact of the second primary beam dispersion on the primary probe spot, and an adjustment of the first primary beam dispersion causes an adjustment of a position of an object plane associated with the objective lens, the object plane being a virtual focal plane for a portion of charged particles of the primary charged particle beam, and wherein a first deflection angle of the primary charged particle beam caused by the first dispersion device is unchanged when the first primary beam dispersion is changed with respect to the second primary beam dispersion.

8. The charged particle beam apparatus of claim 7, wherein the beam separator is configured to cause further deflection of the primary charged particle beam to a second deflection angle based on an energy of a charged particle of the primary charged particle beam.

9. The charged particle beam apparatus of claim 8, wherein the first deflection angle of the primary charged particle beam caused by the first dispersion device is equal and opposite to the second deflection angle of the primary charged particle beam caused by the beam separator.

10. The charged particle beam apparatus of claim 8, wherein the first deflection angle of the primary charged particle beam caused by the first dispersion device is zero.

11. The charged particle beam apparatus of claim 7, wherein the beam separator comprises a Wien filter.

12. The charged particle beam apparatus of claim 11, wherein the first deflection angle of the primary charged particle beam caused by the first dispersion device is zero.

13. The charged particle beam apparatus of claim 7, further comprising one or more secondary charged particle beam deflectors placed between the beam separator and the detector, the one or more secondary charged particle beam deflectors configured to adjust at least one of a position and an angle of the secondary charged particle beam incident on the detector.

14. The charged particle beam apparatus of claim 7, further comprising a multi-pole lens configured to generate a quadrupole field to cancel at least one of impacts of astigmatism aberrations caused by the beam separator and the first dispersion device on the primary probe spot.

15. The charged particle beam apparatus of claim 14, wherein the multi-pole lens is placed adjacent to one of the beam separator and the first dispersion device.

16. The charged particle beam apparatus of claim 7, wherein the beam separator comprises a multi-pole lens configured to generate a quadrupole field to cancel at least one of impacts of astigmatism aberrations caused by the beam separator and the first dispersion device on the primary probe spot.

17. The charged particle beam system of claim 7, wherein the first dispersion device comprises a multi-pole lens configured to generate a quadrupole field to cancel at least one of impacts of astigmatism aberrations caused by the beam separator and the first dispersion device on the primary probe spot.

18. The charged particle beam system of claim 7, further comprising a second dispersion device which is between the beam separator and the detector, the second dispersion device configured to generate a first secondary beam dispersion and the beam separator configured to generate a second secondary beam dispersion to the secondary charged particle beam, the second dispersion device comprising:

a second electrostatic deflector and a second magnetic deflector, wherein an adjustment of corresponding deflection fields thereof makes the first secondary beam dispersion cancel an impact of a second secondary beam dispersion on a secondary probe spot of the secondary charged particle beam on the detector.

19. The charged particle beam system of claim 7, wherein the primary charged particle beam is an electron beam.

20. A method for controlling dispersion in a charged particle beam system with a beam separator and an objective lens, the method comprising:

providing a first dispersion device in a path of a primary charged particle beam of the system;

placing the first dispersion device upstream of the beam separator;

generating a first primary beam dispersion to the primary charged particle beam by the first dispersion device; and adjusting the first primary beam dispersion to cancel an impact of a second primary beam dispersion of the primary charged particle beam caused by the beam separator and to adjust a position of an object plane associated with the objective lens, the object plane being a virtual focal plane for a portion of charged particles of the primary charged particle beam, wherein the first dispersion device comprises a first electrostatic deflector and a first magnetic deflector, respectively exerting a first force and a second force on the primary charged particle beam, and wherein the first force and the second force are opposite to each other and form the first primary beam dispersion, and wherein a deflection angle of the primary charged particle beam caused by the first dispersion device is unchanged when the first primary beam dispersion is changed with respect to the second primary beam dispersion.

* * * * *